US007440287B1

(12) United States Patent
Ni et al.

(10) Patent No.: US 7,440,287 B1
(45) Date of Patent: Oct. 21, 2008

(54) EXTENDED USB PCBA AND DEVICE WITH DUAL PERSONALITY

(75) Inventors: Jim Chin-Nan Ni, San Jose, CA (US); David Q. Chow, San Jose, CA (US); Frank I-Kang Yu, Palo Alto, CA (US); Abraham C. Ma, Fremont, CA (US); Ming-Shiang Shen, Taipei (TW)

(73) Assignee: Super Talent Electronics, Inc., San Jose, CA (US)

( * ) Notice: Subject to any disclaimer, the term of this patent is extended or adjusted under 35 U.S.C. 154(b) by 0 days.

(21) Appl. No.: 11/871,103

(22) Filed: Oct. 11, 2007

Related U.S. Application Data

(60) Continuation-in-part of application No. 11/868,873, filed on Oct. 8, 2007, and a continuation-in-part of application No. 11/866,927, filed on Oct. 3, 2007, which is a continuation-in-part of application No. 11/864,696, filed on Sep. 28, 2007, which is a continuation-in-part of application No. 11/624,667, filed on Jan. 18, 2007, and a continuation-in-part of application No. 10/854,004, filed on May 25, 2004, which is a continuation-in-part of application No. 10/708,172, filed on Feb. 12, 2004, now Pat. No. 7,021,971, which is a division of application No. 09/478,720, filed on Jan. 6, 2000, now Pat. No. 7,257,714, said application No. 11/871,103 is a continuation-in-part of application No. 11/309,847, filed on Oct. 12, 2006, and a continuation-in-part of application No. 11/219,128, filed on Sep. 2, 2005, now Pat. No. 7,259,967.

(51) Int. Cl.
*H05K 7/02* (2006.01)
*H05K 7/10* (2006.01)

(52) U.S. Cl. ....................... 361/752; 361/730; 361/736; 439/660; 439/951; 439/945; 174/50.51; 174/50.52

(58) Field of Classification Search ......... 361/728–730, 361/767, 736, 752; 739/50.51–50.53; 439/76.1, 439/945, 946, 951, 660
See application file for complete search history.

(56) References Cited

U.S. PATENT DOCUMENTS 5,623,552 A 4/1997 Lane
5,907,856 A 5/1999 Estakhri et al.

(Continued)

*Primary Examiner*—Dean A. Reichard
*Assistant Examiner*—Dameon E. Levi
(74) *Attorney, Agent, or Firm*—Blakely Sokoloff Taylor & Zafman LLP

(57) ABSTRACT

An extended Universal-Serial-Bus (USB) connector plug and socket each have a pin substrate with one surface that supports the four metal contact pins for the standard USB interface. An extension of the pin substrate carries another 8 extension metal contact pins that mate when both the connector plug and socket are extended. The extension can be an increased length of the plug's and socket's pin substrate or a reverse side of the substrate. Standard USB connectors do not make contact with the extension metal contacts that are recessed, retracted by a mechanical switch, or on the extension of the socket's pin substrate that a standard USB connector cannot reach. Standard USB sockets do not make contact with the extension metal contacts because the extended connector's extension contacts are recessed, or on the extension of the connector pin substrate that does not fit inside a standard USB socket.

18 Claims, 26 Drawing Sheets

U.S. PATENT DOCUMENTS

| | | | | |
|---|---|---|---|---|
| 5,959,541 | A | 9/1999 | DiMaria et al. | |
| 6,000,006 | A | 12/1999 | Bruce et al. | |
| 6,012,636 | A | 1/2000 | Smith | |
| 6,069,920 | A | 5/2000 | Schulz et al. | |
| 6,081,858 | A | 6/2000 | Abudayyeh et al. | |
| 6,125,192 | A | 9/2000 | Bjorn et al. | |
| 6,193,152 | B1 | 2/2001 | Fernando et al. | |
| 6,202,138 | B1 | 3/2001 | Estakhri et al. | |
| 6,230,233 | B1 | 5/2001 | Lofgren et al. | |
| 6,275,894 | B1 | 8/2001 | Kuo et al. | |
| 6,321,475 | B1 | 11/2001 | Klebes | |
| 6,334,793 | B1 * | 1/2002 | Amoni et al. | 439/680 |
| 6,547,130 | B1 | 4/2003 | Shen | |
| 6,636,929 | B1 | 10/2003 | Frantz et al. | |
| 6,718,407 | B2 | 4/2004 | Martwick | |
| 6,778,401 | B1 * | 8/2004 | Yu et al. | 361/752 |
| 6,880,024 | B2 | 4/2005 | Chen et al. | |
| 7,021,971 | B2 * | 4/2006 | Chou et al. | 439/660 |
| 7,044,802 | B2 * | 5/2006 | Chiou et al. | 439/660 |
| 7,097,472 | B2 * | 8/2006 | Parker | 439/131 |
| 7,103,765 | B2 | 9/2006 | Chen | |
| 7,104,848 | B1 * | 9/2006 | Chou et al. | 439/660 |
| 7,125,287 | B1 * | 10/2006 | Chou et al. | 439/660 |
| 7,155,545 | B1 * | 12/2006 | Wang | 710/72 |
| 7,182,646 | B1 * | 2/2007 | Chou et al. | 439/660 |
| 7,249,978 | B1 * | 7/2007 | Ni | 439/660 |
| 7,257,714 | B1 | 8/2007 | Shen | |
| 7,259,967 | B2 * | 8/2007 | Ni | 361/760 |
| 7,359,208 | B2 * | 4/2008 | Ni | 361/752 |
| 7,361,059 | B2 * | 4/2008 | Harkabi et al. | 439/660 |
| 2001/0043174 | A1 | 11/2001 | Jacobsen et al. | |
| 2002/0166023 | A1 | 11/2002 | Nolan et al. | |
| 2003/0046510 | A1 | 3/2003 | North | |
| 2003/0163656 | A1 | 8/2003 | Ganton | |
| 2004/0148482 | A1 | 7/2004 | Grundy et al. | |
| 2004/0255054 | A1 | 12/2004 | Pua et al. | |
| 2005/0102444 | A1 | 5/2005 | Cruz | |
| 2005/0120146 | A1 | 6/2005 | Chen et al. | |
| 2005/0160213 | A1 | 7/2005 | Chen | |
| 2005/0193161 | A1 | 9/2005 | Lee et al. | |
| 2005/0246243 | A1 | 11/2005 | Adams et al. | |
| 2005/0268082 | A1 | 12/2005 | Poisner | |
| 2006/0065743 | A1 | 3/2006 | Fruhauf | |
| 2006/0075174 | A1 | 4/2006 | Vuong | |
| 2006/0106962 | A1 | 5/2006 | Woodbridge et al. | |
| 2006/0161725 | A1 | 7/2006 | Lee et al. | |
| 2006/0206702 | A1 | 9/2006 | Fausak | |
| 2006/0242395 | A1 | 10/2006 | Fausak | |
| 2007/0094489 | A1 | 4/2007 | Ota et al. | |
| 2007/0112067 | A1 | 5/2007 | Oh et al. | |
| 2007/0113267 | A1 | 5/2007 | Iwanski et al. | |
| 2007/0130436 | A1 | 6/2007 | Shen | |

* cited by examiner

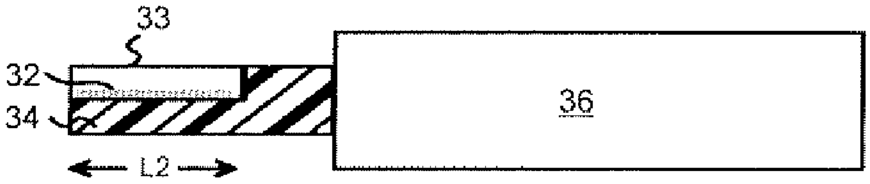
FIG. 3A PRIOR ART
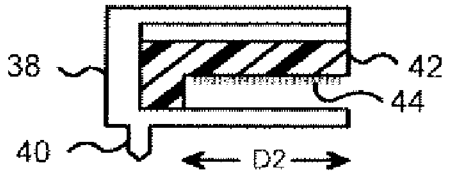
FIG. 3B PRIOR ART
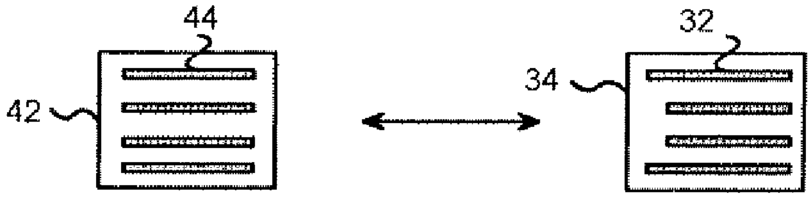
PRIOR ART
FIG. 3C
FIG. 3D

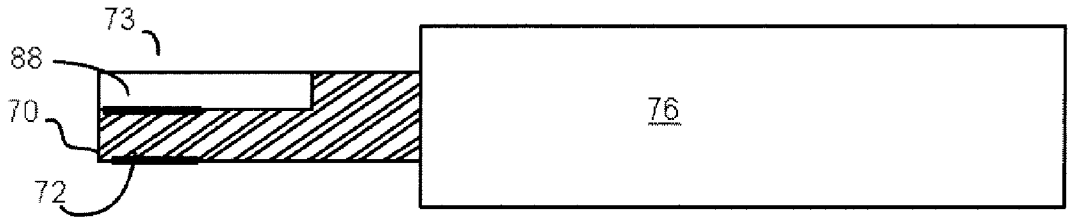
FIG. 4A
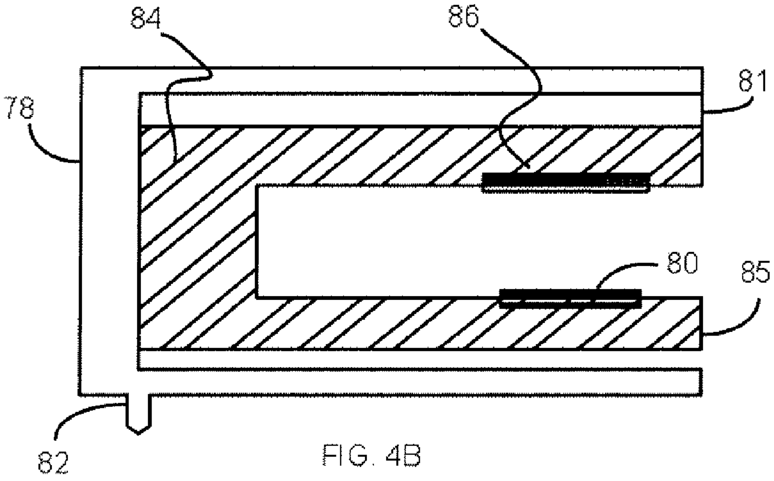
FIG. 4B
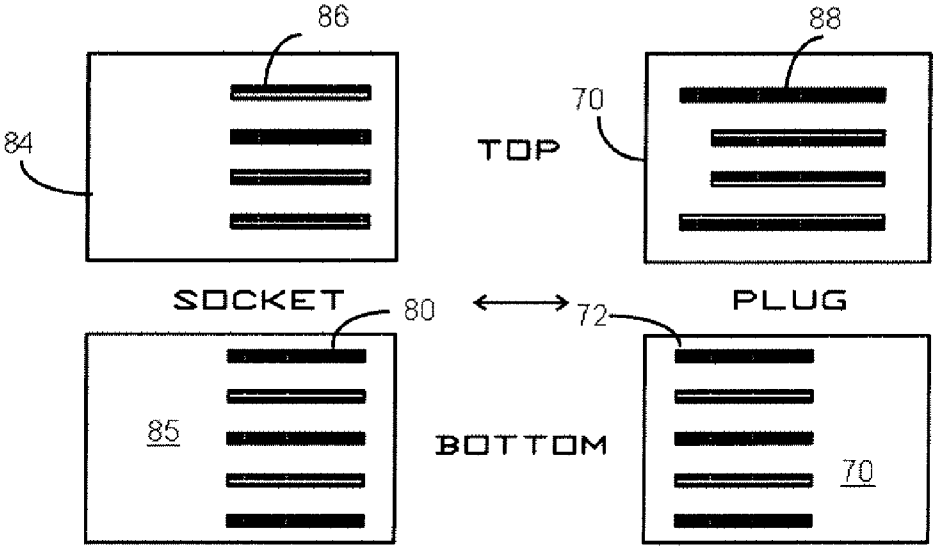
FIG. 4C
FIG. 4D

Table of Extended and Standard Pins in the Extended USB Connector and Socket

| SIDE | PIN-OUT | USB | MODIFIED PCIE 0 | SATA | MODIFIED PCIE 1 | MODIFIED PCIE 2 | MODIFIED PCIE 3 |
|---|---|---|---|---|---|---|---|
| A | 1 | 5V | 5V | 5V | 5V | 5V | 5V |
| A | 2 | D- | D- | D- | D- | D- | D- |
| A | 3 | D+ | D+ | D+ | D+ | D+ | D+ |
| A | 4 | GND | GND | GND | GND | GND | GND |
| B | 1 | | 3.3V | 3.3V | PETn | PETn | PETn |
| B | 2 | | 1.5V | N/C | PETp | PETp | PETp |
| B | 3 | | PETn | T- | GND | GND | GND |
| B | 4 | | PETp | T+ | PERn | PERn | PERn |
| B | 5 | | GND | GND | PERp | PERp | PERp |
| B | 6 | | PERn | R- | | PETn 1 | PETn 1 |
| B | 7 | | PERp | R+ | | PETp 1 | PETp 1 |
| B | 8 | | N/C | 12V | | GND | GND |
| B | 9 | | | | | PERn 1 | PERn 1 |
| B | 10 | | | | | PERp 1 | PERp 1 |
| B | 11 | | | | | | PETn 2 |
| B | 12 | | | | | | PETp 2 |
| B | 13 | | | | | | GND |
| B | 14 | | | | | | PERn 2 |
| B | 15 | | | | | | PERp 2 |
| B | 16 | | | | | | PETn 3 |
| B | 17 | | | | | | PETp 3 |
| B | 18 | | | | | | GND |
| B | 19 | | | | | | PERn 3 |
| B | 20 | | | | | | PERp 3 |

FIG. 9

| | | | | |
|---|---|---|---|---|
| Sector 1 | data | data | data | data |
| Sector 2 | empty | empty | empty | empty |
| Sector 3 | empty | empty | empty | empty |
| Sector 4 | empty | empty | empty | empty |

FIG 10a

| | | | | |
|---|---|---|---|---|
| Sector 1 | data | data | data | data |
| Sector 2 | 512byte-A | 512byte-B | empty | empty |
| Sector 3 | empty | empty | empty | empty |
| Sector 4 | empty | empty | empty | empty |

FIG 10b

In FIG 10b 512byte-A and 512byte-B are currently received data from Host

| | | | | |
|---|---|---|---|---|
| Sector 1 | data | data | data | data |
| Sector 2 | 512byte-A | 512byte-B | empty | empty |
| Sector 3 | 512byte-A | 512byte-B | **512byte-C** | **512byte-D** |
| Sector 4 | empty | empty | empty | empty |

FIG 10c

In FIG 10c 512byte-A and 512byte-B are copied from sector 2 to Sector 3

In FIG 10c 512byte-C and 512byte-D are currently received data from Host

| | | | | |
|---|---|---|---|---|
| Sector 1 | data | data | data | data |
| Sector 2 | 512byte-A | 512byte-B | **512byte-C** | **512byte-D** |
| Sector 3 | empty | empty | empty | empty |
| Sector 4 | empty | empty | empty | empty |

FIG 10d

FIG 10d This action needs two times of programming, and it is not allowed for some flash ch

EXTENDED USB PCBA AND DEVICE WITH DUAL PERSONALITY

RELATED APPLICATIONS

This is a continuation-in-part (CIP) of co-pending U.S. patent application Ser. No. 11/868,873, filed Oct. 8, 2007, entitled "Extended USB PCBA And Device With Dual Personality", which is a CIP of U.S. patent application Ser. No. 11/864,696, entitled "Backward Compatible Extended USB Plug And Receptacle With Dual Personality", filed Sep. 28, 2007, which is a CIP of U.S. patent application for "Electronic Data Storage Medium With Fingerprint Verification Capability", U.S. application Ser. No. 11/624,667, filed on Jan. 18, 2007, which is a divisional application of U.S. patent application Ser. No. 09/478,720, filed on Jan. 6, 2000, now U.S. Pat. No. 7,257,714 and a CIP of U.S. patent application for "Extended USB Plug, USB PCBA, and USB Flash Drive with Dual Personality", U.S. application Ser. No. 11/866,927, filed Oct. 3, 2007, and a CIP of U.S. patent application for "Extended Secure-Digital Card Devices and Hosts," U.S. application Ser. No. 10/854,004, filed May 25, 2004, which is a CIP of U.S. patent application Ser. No. 10/708,172, filed Feb. 12, 2004 now U.S. Pat. No. 7,021,971.

This application is also a CIP of U.S. patent application Ser. No. 11/219,128, filed Sep. 2, 2005, now U.S. Pat. No. 7,259,967 entitled "USB Device with Plastic Housing Having Integrated Plastic Plug Shell", and U.S. patent application Ser. No. 11/309,847, filed Oct. 12, 2006, entitled "USB Device with Integrated USB Plug with USB-Substrate Supporter Inside."

This application is also related to U.S. Pat. Nos. 7,021,971, 7,108,560, 7,125,287, and 7,104,848.

The disclosure of the aforementioned patent applications and patents are incorporated herein by reference in its entirety.

FIELD OF THE INVENTION

This invention relates to serial-bus connectors, and more particularly to dual USB and PCI Express connectors.

BACKGROUND OF THE INVENTION

Universal-Serial-Bus (USB) has been widely deployed as a standard bus for connecting peripherals such as digital cameras and music players to personal computers (PCs) and other devices. Currently, the top transfer rate of USB is 480 Mb/s, which is quite sufficient for most applications. Faster serial-bus interfaces are being introduced to address different requirements. PCI Express, at 2.5 Gb/s, and SATA, at 1.5 Gb/s and 3.0 Gb/s, are two examples of high-speed serial bus interfaces for the next generation devices, as are IEEE 1394 and Serial Attached Small-Computer System Interface (SCSI).

FIG. 1 shows a block diagram of a conventional electronic data flash card. Referring to FIG. 1, according to an embodiment of the present invention, an electronic data flash card 10 is adapted to be accessed by an external (host) computer 9 either via an interface bus 13 or a card reader 12 or other interface mechanism (not shown), and includes a card body 1, a processing unit 2, one or more flash memory devices 3, a fingerprint sensor 4, an input/output interface circuit 5, an optional display unit 6, an optional power source (e.g., battery) 7, and an optional function key set 8.

Flash memory device 3 is mounted on the card body 1, stores in a known manner therein one or more data files, a reference password, and the reference fingerprint data obtained by scanning a fingerprint of one or more authorized users of the electronic data flash card 10. Only authorized users can access the stored data files. The data file can be a picture file or a text file.

The fingerprint sensor 4 is mounted on the card body 1, and is adapted to scan a fingerprint of a user of electronic data flash card 10 to generate fingerprint scan data. One example of the fingerprint sensor 4 that can be used in the present invention is that disclosed in a co-owned U.S. Pat. No. 6,547,130, entitled "INTEGRATED CIRCUIT CARD WITH FINGERPRINT VERIFICATION CAPABILITY", the entire disclosure of which is incorporated herein by reference. The fingerprint sensor described in the above patent includes an array of scan cells that defines a fingerprint scanning area. The fingerprint scan data includes a plurality of scan line data obtained by scanning corresponding lines of array of scan cells. The lines of array of scan cells are scanned in a row direction as well as column direction of said array. Each of the scan cells generates a first logic signal upon detection of a ridge in the fingerprint of the holder of card body, and a second logic signal upon detection of a valley in the fingerprint of the holder of card body.

The input/output interface circuit 5 is mounted on the card body 1, and can be activated so as to establish communication with the host computer 9 by way of an appropriate socket via an interface bus 13 or a card reader 12. In one embodiment, input/output interface circuit 5 includes circuits and control logic associated with a Universal Serial Bus (USB), PCMCIA or RS232 interface structure that is connectable to an associated socket connected to or mounted on the host computer 9.

Universal-Serial-Bus (USB) is a widely used serial-interface standard for connecting external devices to a host such as a personal computer (PC). Another new standard is PCI Express, which is an extension of Peripheral Component Interconnect (PCI) bus widely used inside a PC for connecting plug-in expansion cards. One objective of PCI Express is to preserve and re-use PCI software. Unfortunately, conventional USB connectors with their 4 metal contacts do not support the more complex PCI Express standard.

In another embodiment, the input/output interface circuit 5 may include one of a Secure Digital (SD) interface circuit, a Multi-Media Card (MMC) interface circuit, a Compact Flash (CF) interface circuit, a Memory Stick (MS) or Memory Stick-Pro (MS-Pro) interface circuit, a PCI-Express interface circuit, a Integrated Drive Electronics (IDE) interface circuit, a Serial Advanced Technology Attachment (SATA) interface circuit external SATA Radio Frequency Identification (RFID) interface circuit, which may interface with the host computer 9 via an interface bus and/or a card reader (not shown).

The processing unit 2 is mounted on the card body 1, and is connected to the flash memory device 3, the fingerprint sensor 4 and the input/output interface circuit 5 by way of associated conductive traces or wires disposed on card body 1. In one embodiment, processing unit 2 is one of an 8051, 8052, 80286 microprocessors available, for example, from Intel Corporation. In other embodiments, processing unit 2 includes a RISC, ARM, MIPS or other digital signal processors (DSP). In accordance with an aspect of the present invention, processing unit 2 is controlled by a program stored at least partially in flash memory device 3 such that processing unit 2 is operable selectively in: (1) a programming mode, where the processing unit 2 activates the input/output interface circuit 5 to receive the data file and the reference fingerprint data from the host computer 9, and to store the data file and the reference fingerprint data in flash memory device 3; (2) a data retrieving mode, where the processing unit 2 activates the input/output interface circuit 5 to transmit the data file stored in flash memory device 3 to the host computer 9; and (3) a data resetting mode, where the data file and the reference finger data are erased from the flash memory device 3. In operation, host computer 9 sends write and read requests to electronic data flash card 10 via interface bus 13 or a card reader 12 and input/output interface circuit 5 to the processing unit 2, which in turn utilizes a flash memory controller (not shown) to read from or write to the associated one or more flash memory devices 3. In one embodiment, for further security protection, the processing unit 2 automatically initiates operation in the data resetting mode upon detecting that a preset time period has elapsed since the last authorized access of the data file stored in the flash memory device 3.

The optional power source 7 is mounted on the card body 1, and is connected to the processing unit 2 and other associated units on card body 1 for supplying electrical power thereto.

The optional function key set 8, which is mounted on the card body 1, is connected to the processing unit 2, and is operable so as to initiate operation of processing unit 2 in a selected one of the programming, data retrieving and data resetting modes. The function key set 8 is operable to provide an input password to the processing unit 2. The processing unit 2 compares the input password with the reference password stored in the flash memory device 3, and initiates authorized operation of electronic data flash card 10 upon verifying that the input password corresponds with the reference password.

The optional display unit 6 is mounted on the card body 1, and is connected to and controlled by the processing unit 2 for showing the data file exchanged with the host computer 9 and for displaying the operating status of the electronic data flash card 10.

The following are some of the advantages of the present invention: first, the electronic data flash card has a small volume but a large storage capability, thereby resulting in convenience during data transfer; and second, because everyone has a unique fingerprint, the electronic data flash card only permits authorized persons to access the data files stored therein, thereby resulting in enhanced security.

FIG. 2 is a block diagram of another conventional electronic data flash card 10A that omits the fingerprint sensor and the associated user identification process. The electronic data flash card includes a highly integrated processing unit 2A, an input/output interface circuit 5A, and a memory device 3. Input/output interface circuit 5A may include a transceiver block, a serial interface engine block, data buffers, registers, and interrupt logic. Input/output interface circuit 5A is coupled to an internal bus to allow for the various elements of input/output interface circuit 5A to communicate with the processing unit 2A. Processing unit 2A may include a microprocessor unit, a ROM, a RAM, flash memory controller logic or a flash memory controller, error correction code logic, and general-purpose input/output (GPIO) logic. The GPIO logic may be coupled to a plurality of LEDs for status indication such as power good, read/write flash activity, etc., and other I/O devices. Processing unit 2A is coupled to one or more flash memory devices 3.

In FIG. 2, host computer 9A may include a function key set, which is connected to the processing unit 2A via an interface bus or a card reader when electronic data flash card 10A is in operation. Function key set is used to selectively set electronic data flash card 10A in one of the programming, data retrieving and data resetting modes. The function key set is also operable to provide an input password to the host computer 9A. The processing unit 2A compares the input password with the reference password stored in the flash memory device 3, and initiates authorized operation of electronic data flash card 10A upon verifying that the input password corresponds with the reference password.

Also, a host computer 9A may include a display unit, which is connected to the processing unit 2A when electronic data flash card 10A is in operation via an interface bus or a card reader. Display unit is used for showing the data file exchanged with the host computer 9A, and for showing the operating status of the electronic data flash card 10A.

FIGS. 3A-D shows cross-sections of a prior-art USB connector and socket. In FIG. 3A, a prior-art peripheral-side plug or USB connector has plastic housing 36 that the user can grip when inserting the USB connector into a USB socket such as the socket in FIG. 3B. Pin substrate 34 can be made of ceramic, plastic, or other insulating material, and supports metal contact pins 32. There are 4 metal contact pins 32 arranged as shown in the top view of pin substrate 34 in FIG. 3D. Metal cover 33 is an open-ended rectangular tube that wraps around pin substrate 34 and the gap above metal contact pins 32.

In FIG. 3B, a prior-art host-side USB socket is shown, such as a USB socket on a host PC. Metal cover 38 is rectangular tube that surrounds pin substrate 42 and has an opening to receive the USB connector's pin substrate 34. Metal contact pins 44 are mounted on the underside of pin substrate 42. Mounting pin 40 is formed from metal cover 38 and is useful for mounting the USB socket to a printed-circuit board (PCB) or chassis on the host PC.

Metal contact pins 44 are arranged as shown in the bottom view of pin substrate 42 of FIG. 3C. The four metal contact pins 44 are arranged to slide along and make contact with the four metal contact pins 32 when the USB connector is inserted into the USB socket. Pin substrates 34, 42 are formed in an L-shape with matching cutouts above metal contact pins 32 and below metal contact pins 44 that fit together when inserted.

Metal contact pins 32, 44 can have a slight bend or kink in them (not shown) to improve mechanical and electrical contact. The bend produces a spring-like action that is compressed when the USB connecter is inserted into the USB socket. The force of the compressed spring improves contact between metal contact pins 32, 44.

While useful, prior-art USB sockets and connectors have only four metal contact pins 32 that mate with four metal contact pins 44. The four metal contact pins carry power, ground, and differential data lines D+, D−. There are no additional pins for extended signals required by other standard buses, such as PCI Express or Serial ATA.

What is desired is an extended USB socket and connector. An extended-USB connector that fits into standard USB sockets, yet has additional metal contacts is desirable. An extended-USB socket that can receive a standard USB connector or the extended USB connector is also desired. The extended socket and connector when mated carry additional signals, allowing for higher-speed bus interfaces to be used. A higher-speed extended connector and socket that are physically and electrically compatible with existing USB sockets and connector is desirable. Auto-detection of higher-speed capabilities is desired when the extended USB connector is plugged into the extended USB socket.

BRIEF DESCRIPTION OF THE DRAWINGS

FIGS. 3A-D shows cross-sections of a prior-art USB connector and socket.

FIGS. 4A-G show a first embodiment of extended USB connectors and sockets having metal contact pins on both top and bottom surfaces of the pin substrates.

FIG. 9 is a table of extended and standard pins in the extended USB connector and socket.

FIGS. 10*a*-10*d* illustrate an example for Multi-Time Programming problem, which occurred in MLC (MBC) flash memory systems.

DETAILED DESCRIPTION

The present invention relates to an improvement in flash memory card connectors and sockets. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Since many conventional USB connectors and sockets (also referred to as standard USB connectors and standard USB sockets) are widely deployed, it is advantageous for the improved enhanced USB connector to be compatible with standard USB sockets, and an enhanced USB socket to be compatible with standard USB connectors for backward compatibility. Since the height and width of USB connectors/sockets have to remain the same for insertion compatibility, the length of each may be extended to fit additional metal contacts for additional signals.

Furthermore, additional metal contacts may be placed on the opposite side of the pin substrates, opposite the existing four metal contact pins. These additional pins must not touch the metal housing or metal cover to prevent shorting to ground when the metal cover is grounded.

Figure 1:
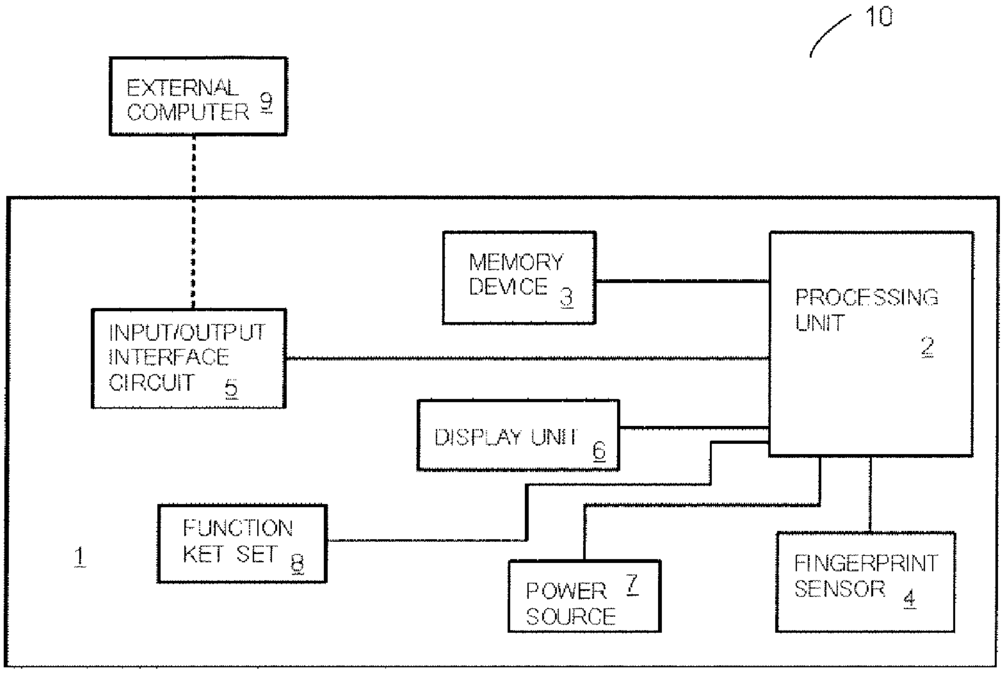
FIG. 1 shows a block diagram of a conventional electronic data flash card.
Figure 2:
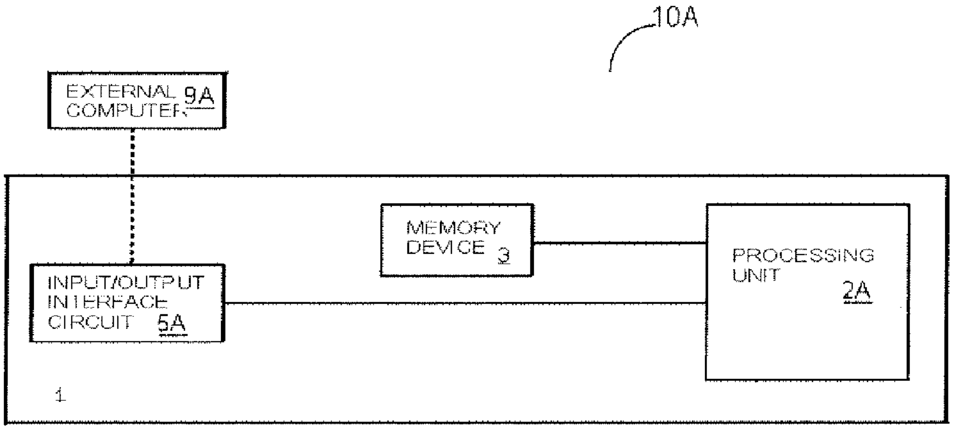
FIG. 2 is a block diagram of another conventional electronic data flash card 10A that omits the fingerprint sensor and the associated user identification process.
Figure 4E:
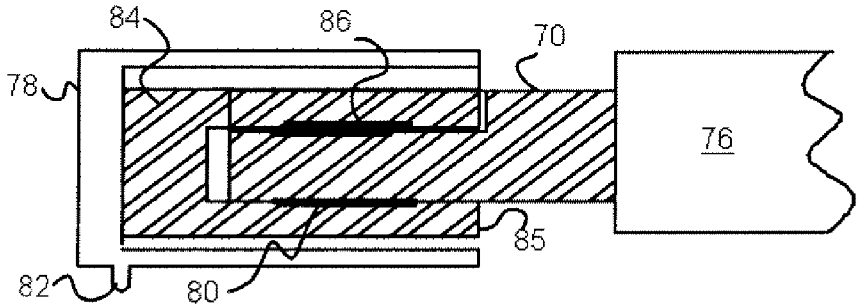

FIGS. 4A-I show a first embodiment of extended USB connectors and sockets having metal contact pins on both top and bottom surfaces of the pin substrates. In FIG. 4A, the extended connector has plastic housing 76 that the user can grip when inserting the connector plug into a socket. Pin substrate 70 supports four metal contact pins 88 on the top surface. Pin substrate 70 is an insulator such as ceramic, plastic, or other material. Metal leads or wires can pass through pin substrate 70 to connect metal contact pins 88 to wires inside plastic housing 76 that connect to the peripheral device.

Five reverse-side metal contact pins 72 are placed in a recess in the bottom side of pin substrate 70 near the tip of the connector plug. Reverse-side metal contact pins 72 are additional pins for extended signals, such as for PCI-Express signals. Metal leads or wires can pass through pin substrate 70 to connect reverse-side metal contact pins 72 to wires inside plastic housing 76 that connect to the peripheral device.

In some embodiments, metal cover 73 is a rectangular tube that surrounds pin substrate 70 and has an open end. An opening in metal cover 73 on the bottom of pin substrate 70 allows reverse-side metal contact pins 72 to be exposed.

FIG. 4B shows an extended-USB socket having four metal contact pads on top surface and five metal contact pads on bottom surface of the pin substrate. Pin substrate 84 has four metal contact pads 86 formed on a bottom surface facing a cavity that pin substrate 70 of the connector fits into. Pin substrate 84 also has lower substrate extension 85 that is not present on the prior-art USB socket, which has an L-shaped pin substrate.

Five metal contact pads 80 are mounted on lower substrate extension 85 near the open-end of the cavity. A bump or spring can be formed on extension metal contact pads 80, such as by bending flat metal pads. This bump allows extension metal contact pads 80 to reach reverse-side metal contact pins 72 which are recessed in pin substrate 70 of the connector.

A cavity is formed by the bottom surface of pin substrate 84 and the top surface of lower substrate extension 85 and the back of pin substrate 84 then connects to lower substrate extension 85. Metal cover 78 is a metal tube that covers pin substrate 84 and lower substrate extension 85. Metal cover 73 of the USB connector fits in gaps 81 between metal cover 78 and the top and sides of pin substrate 84. Mounting pin 82 can be formed on metal cover 78 for mounting the extended USB socket to a PCB or chassis.

FIG. 4C shows the bottom surface of pin substrate 84, which supports metal contact pins 86. These four pins carry the prior-art USB differential signals, power, and ground, and make contact with metal contact pins 88 of the extended USB connector on the top surface of pin substrate 70, shown in FIG. 4D.

The extended USB connector has 5 reverse-side metal contact pins 72 on the bottom surface of pin substrate 70, arranged as shown in FIG. 4D. These make contact with extension metal contact pins 80, arranged as shown in FIG. 4C on lower substrate extension 85. These 5 extension pins carry extended signals, such as for PCI-Express.

FIG. 4E shows the extended 9-pin USB connector plug inserted into the 9-pin USB socket. When fully inserted, the tip of pin substrate 70 fits into the cavity between pin substrate 84 and lower substrate extension 85 of the extended USB socket. On the upper surface of connector pin substrate 70, metal contact pins 88 make contact with the four metal contact pins 86 of socket pin substrate 84, while reverse-side metal contact pins 72 on the bottom surface of pin substrate 70 make contact with extension metal contact pins 80 on the top surface of lower substrate extension 85.

Figure 4F:
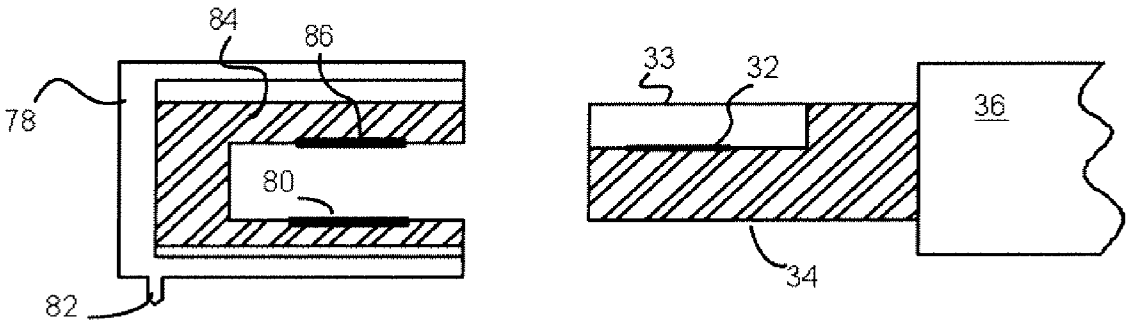
Figure 4G:
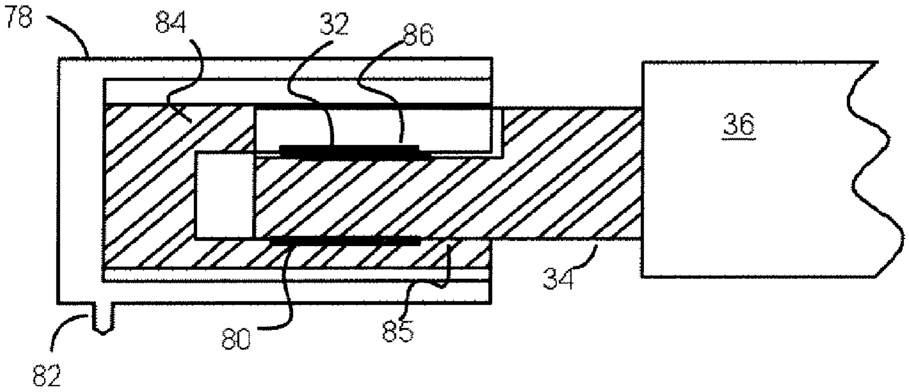

Since reverse-side metal contact pins 72 are recessed, they do not make contact with metal cover 38 of the prior-art USB socket. FIG. 4F shows a standard 4-pin USB connector and the extended 9-pin USB socket, just before insertion of the USB connector into the extended USB socket. When fully inserted, as shown in FIG. 4G, the tip of connector pin substrate 34 fits under socket pin substrate 84, but does not reach the back of the cavity. On the upper surface of connector pin substrate 34, metal contact pins 32 make contact with the four metal contact pins 86 of socket pin substrate 84. Since the standard 4-pin USB connector has 4 pins 32 only, the contact pads on the upper surface of socket pin substrate 85 makes no electrical contact with the USB connector.

Figure 5A:
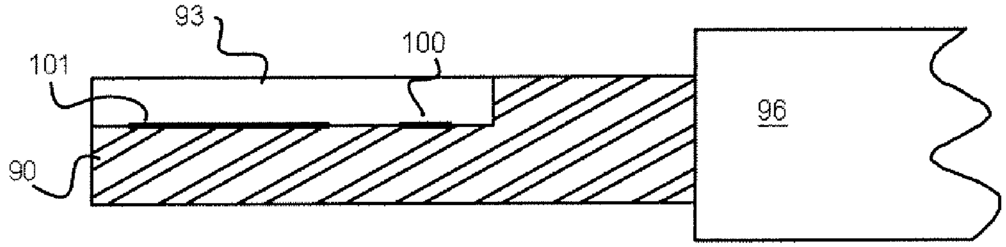
FIGS. 5A-I show a second embodiment of extended USB connectors and sockets having metal contact pins on just one of the surfaces of the pin substrates.

FIGS. 5A-I show a second embodiment of extended USB connectors and sockets having metal contact pins on just one of the surfaces of the pin substrates. FIG. 5A illustrates an extended 9-pin USB connector plug having four metal pins and five extended metal pins on a top surface of pin substrate. In FIG. 5A, the extended connector has plastic housing 96 that the user can grip when inserting the connector plug into a socket. Pin substrate 90 supports metal contact pins 100, 101 on the top surface. Pin substrate 90 is an insulator such as ceramic, plastic, or other material. Metal leads or wires can pass through pin substrate 90 to connect metal contact pins 100, 101 to wires inside plastic housing 96 that connect to the peripheral device.

The length of pin substrate 90 is longer than the length L2 of pin substrate 34 in the prior-art USB connector of FIG. 3A. The extension in length can be 2-5 millimeters. Tip-end metal contact pins 101 are located mostly in the extension region beyond L2. Metal cover 93 is a rectangular tube that surrounds pin substrate 90 and has an open end.

Figure 5B:
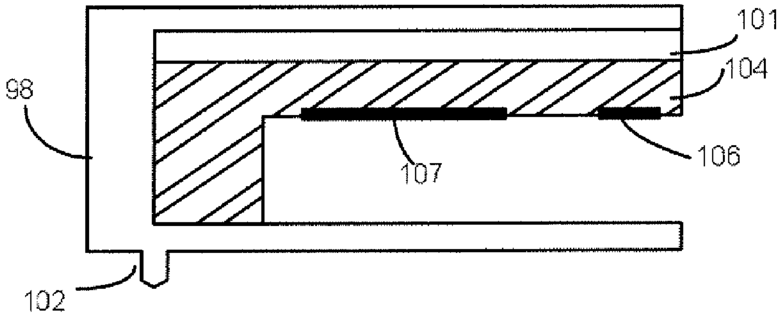

FIG. 5B shows an extended-USB socket having 4 metal contact pins and 5 extended metal pins on just one of the surfaces of the pin substrate. Pin substrate 104 has metal contact pins 106, 107 formed on a bottom surface facing a cavity that pin substrate 90 of the connector fits into. Pin substrate 104 does not need the lower substrate extension of FIGS. 4B, but can have the L-shape as shown.

Metal cover 98 is a metal tube that covers pin substrate 104 and the opening underneath. Metal cover 93 of the USB connector fits in gaps 101 between metal cover 98 and the top and sides of pin substrate 104. Mounting pin 102 can be formed on metal cover 98 for mounting the extended USB socket to a PCB or chassis.

Figure 5C:
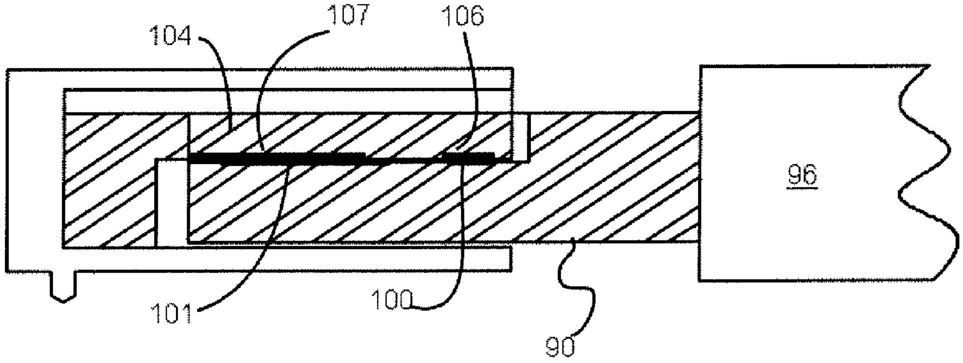

FIG. 5C shows an extended 9-pin USB connector plug inserted into the 9-pin USB socket. The metal contact pins 107 and 106 formed on the bottom surface of the pin substrate 104 of the socket are in contact with the metal pins 101 and 100, respectively, on the pin substrate 90.

Figure 5D:
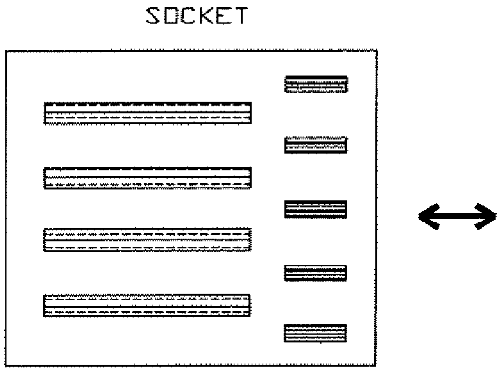
Figure 5E:
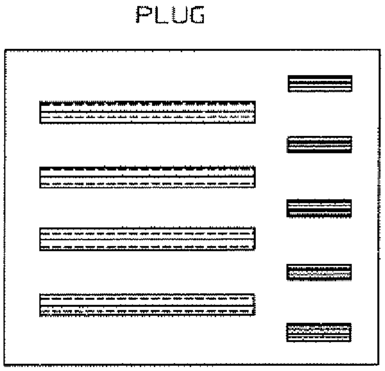

FIG. 5D shows the bottom surface of socket pin substrate 104, which supports metal contact pins 106, 107. Primary metal contact pins 106 are in a first row of 5 pins that are closest to the socket opening. Secondary metal contact pins 107 are in a second row of 4 pins that are farthest from the socket opening.

Secondary metal contact pins 107 include the four USB pins. The primary metal contact pins 106 include extension pins for supporting other interface standards, such as PCI-Express.

When the extended USB connector is fully inserted into the extended USB socket, the tip of pin substrate 90 fits into the cavity under pin substrate 104 of the extended USB socket. On the upper surface of connector pin substrate 90, metal contact pins 100 make contact with the six primary metal contact pins 106 of socket pin substrate 104, and metal contact pins 101 at the tip of the top surface of pin substrate 90 make contact with secondary extension metal contact pins 107 on the downward-facing surface of pin substrate 104.

Figure 5F:
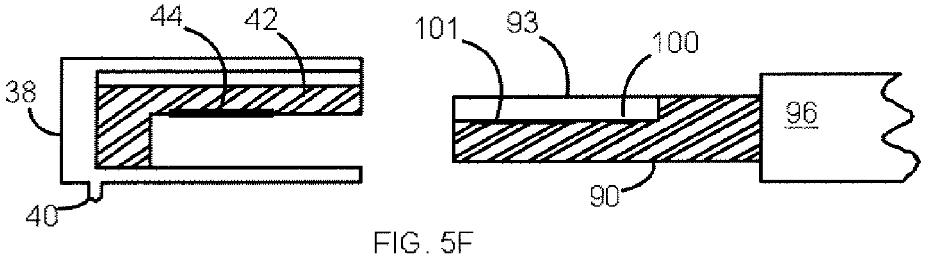
Figure 5G:
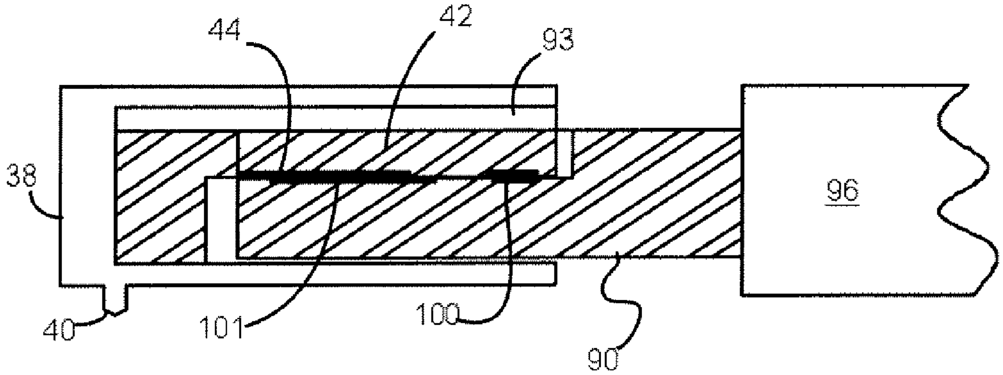

FIG. 5F shows an extended 9-pin USB connector plug just before insertion into a standard 4-pin USB socket. When fully inserted, as shown in FIG. 5G, the tip of pin substrate 90 fits under socket pin substrate 42. On the upper surface of connector pin substrate 90, the 1st, 3rd, 4th, and 6th of tip-end metal contact pins 101 make contact with the four USB metal contact pins 44 of socket pin substrate 42. The back-end row of metal contact pins 100 on the top surface of pin substrate 90 do not make contact with socket metal cover 38 or any metal contacts since they are too far back on connector pin substrate 90. Thus only the four standard USB pins (metal contact pins 44, 101) are electrically contacted.

Figure 5H:
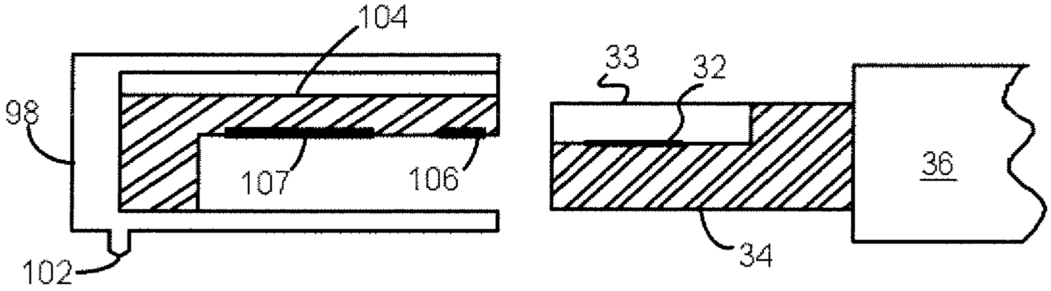
Figure 5I:
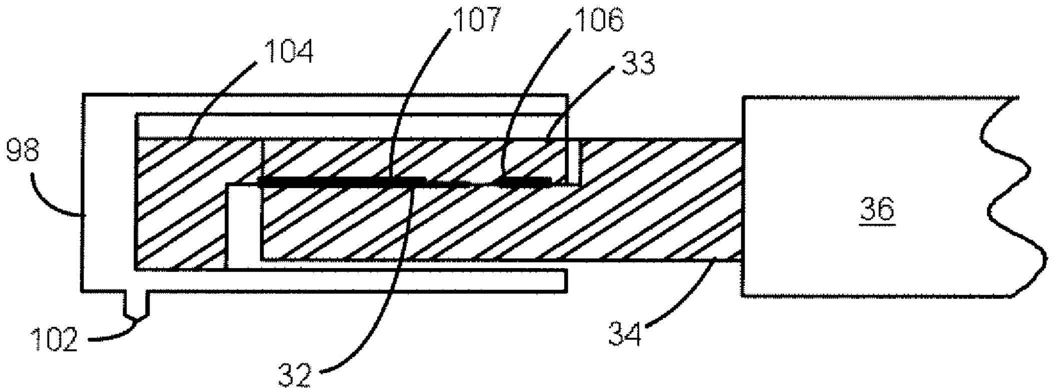

FIG. 5H shows a standard 4-pin USB connector plug just before insertion into an extended 9-pin USB socket. When fully inserted, as shown in FIG. 5I, the tip of connector pin substrate 34 fits under socket pin substrate 104, but does not reach the back of the socket cavity. On the upper surface of connector pin substrate 34, metal contact pins 32 make contact with the 1st, 3rd, 4th, and 6th of the four primary metal contact pins 106 of socket pin substrate 104. Secondary metal contact pins 107 on substrate 104 do not touch connector metal cover 33 since the depth of the extended USB socket is greater than the length of the prior-art USB connector. Thus only the four standard USB pins (metal contact pins 32, 106) are electrically contacted. As illustrated in FIGS. 5F-5I, the extended 9-pin USB connector plugs and socket are electrically and mechanically compatible with standard prior-art 4-pin USB sockets and connector plugs.

Figure 6A:
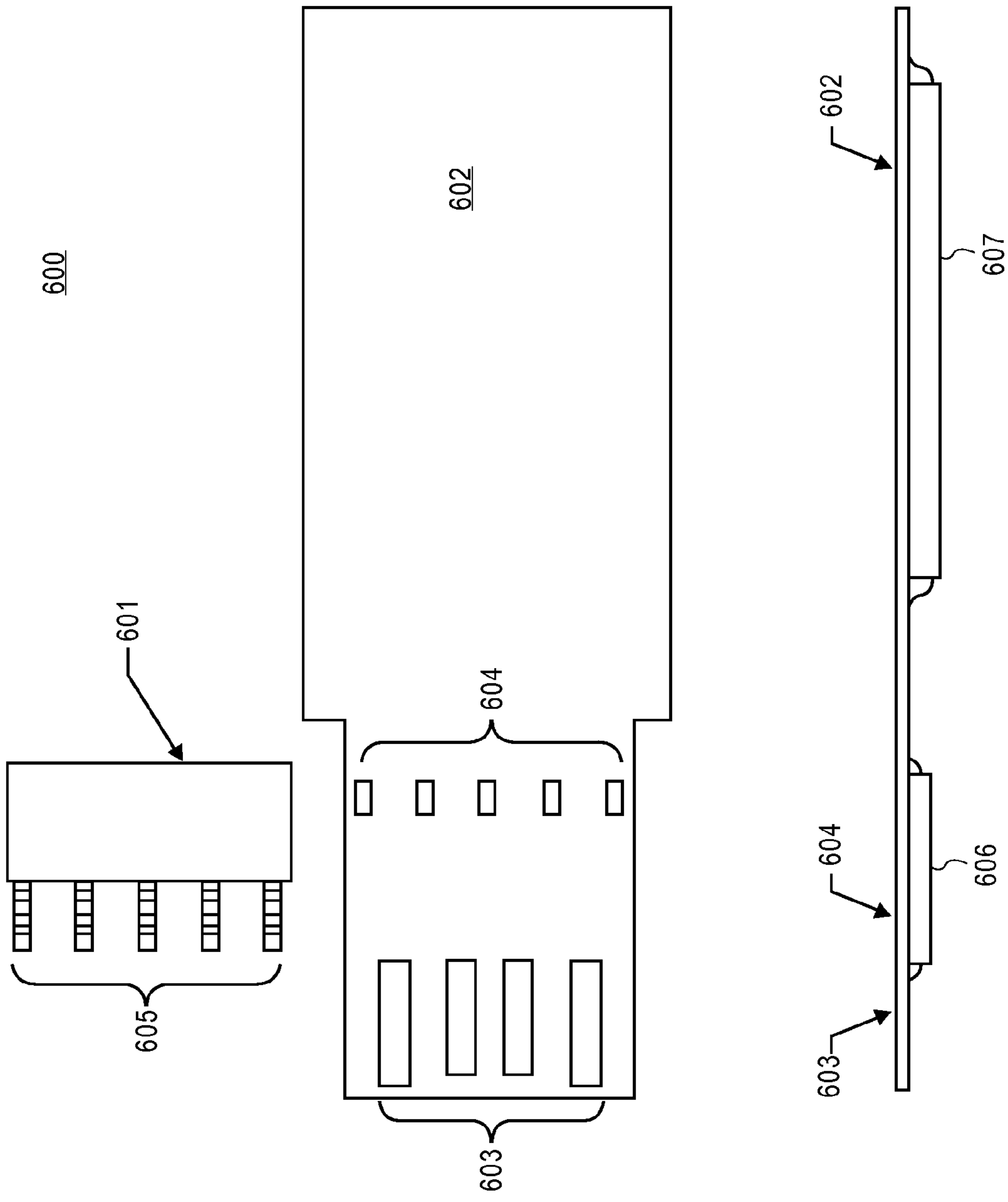
FIGS. 6A-6G show extended an MLC USB plug, PCBA, and device assembly configurations according to certain embodiments of the invention.
Figure 6B:
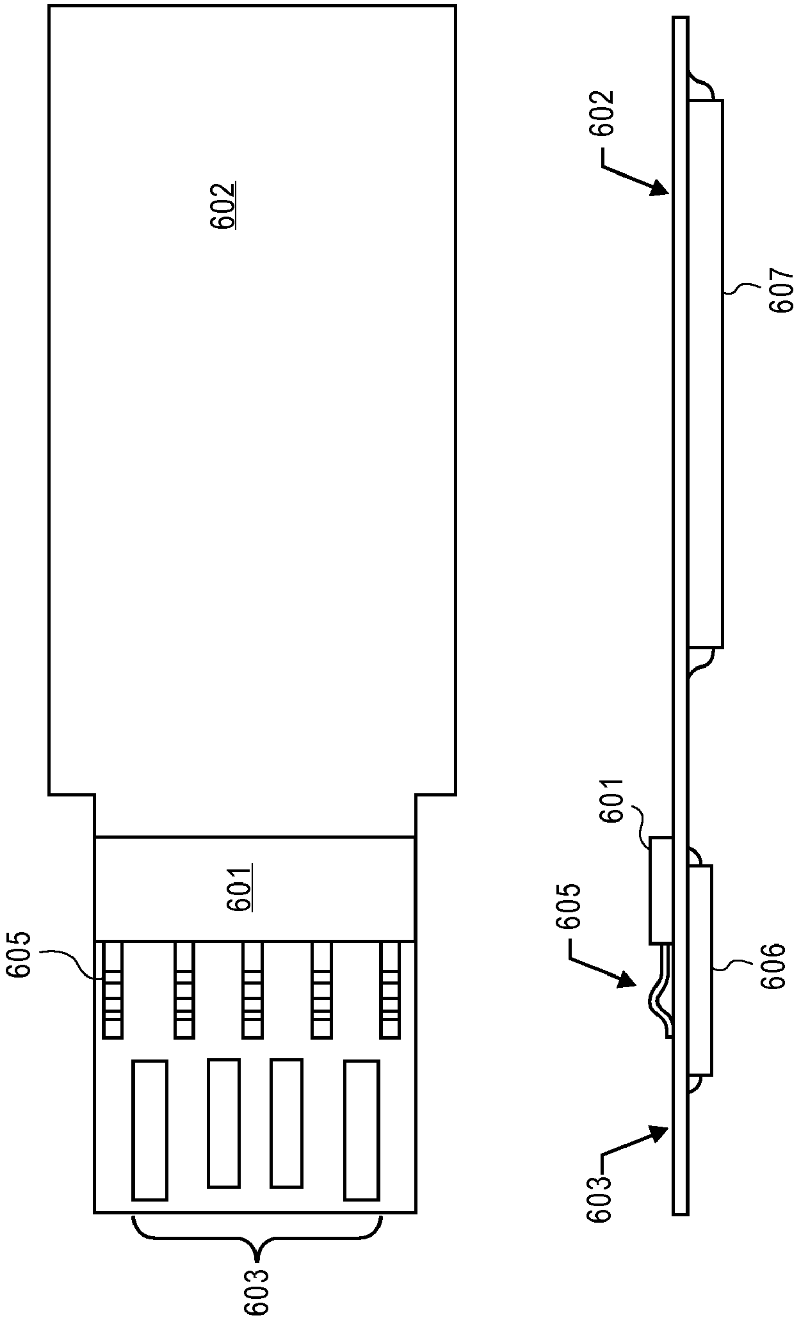

FIGS. 6A-6G are diagrams illustrating examples of USB assembly packages having a dual personality USB plug according to certain embodiments of the invention. Referring to FIGS. 6A-6B, printed circuit board assembly (PCBA) 600 includes a molded lead frame chip connector 601 disposed on a PCB 602. PCB 602 includes a first row of electrical contact pads 603 and a second row of electrical contact pads 604 disposed on a surface such as a top surface of PCB 602. Connector 601 includes multiple electrical contact pins 605 corresponding to the electrical contact pads 604 of PCB 602. When connector 601 is disposed on PCB 602, the contact pins 605 of connector 601 can be soldered on the corresponding contact pads 604 using surface mount (SMT) techniques. In one embodiment, electrical pads 603 include four pads and electrical pads 604 include five pads, forming an extended 9-pin PCBA USB plug. Electrical contact pads 603 is part of dual personality plug extended from the PCB 602, for example, including additional electrical contact pads or pins on an opposite side of PCB 602 for the purposes of multiple interfaces or personalities as described in the above incorporated by references applications and/or patents. In addition, additional components 606-607 may be mounted on an opposite side (e.g., bottom surface), such as, for example, a flash memory IC and/or flash controller IC, etc.

Figure 6C:
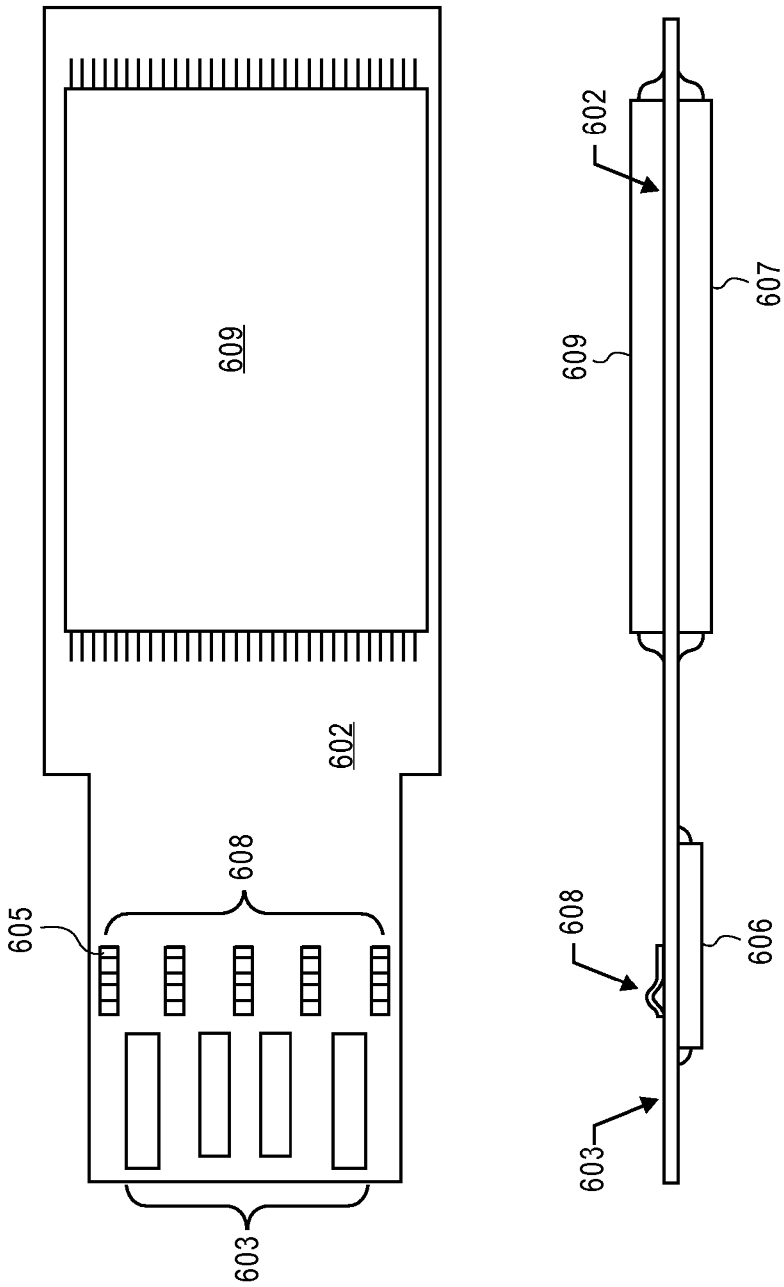

Referring now to FIG. 6C, according to an alternative embodiment of the invention, instead soldering a chip connector 601 on the electrical pads 604 of PCB 602, extended pin terminals 608 may be soldered on the electrical pads 604. In addition, an additional component or IC 609 may be disposed on the top surface of PCB 602.

Figure 6D:
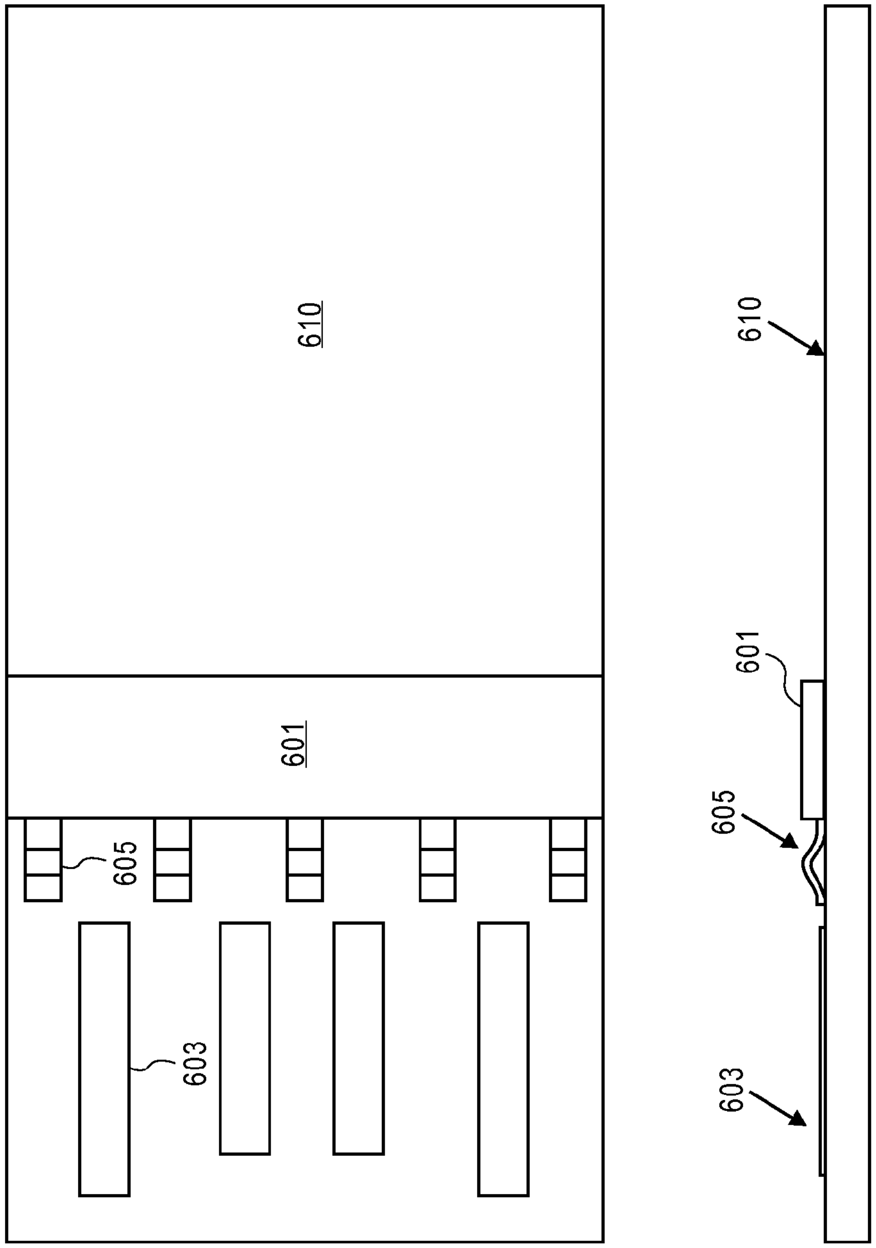
Figure 6E:
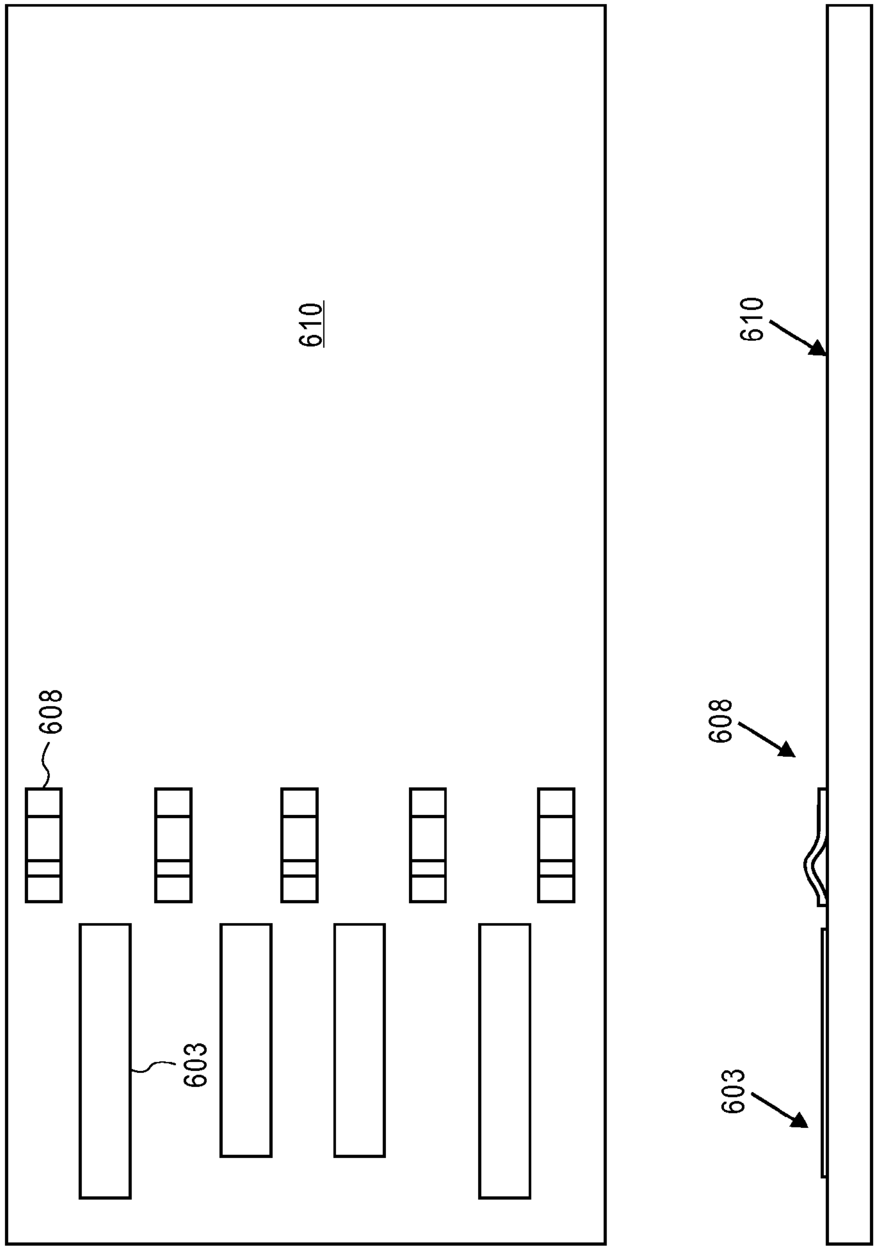

Referring now to FIG. 6D, according to another embodiment of the invention, PCB 602 may be replaced with a chip-on-board (COB) package 610. The top surface of the COB 610 includes certain electrical pads such as pads 603-604 forming an extended USB dual-personality plug. In this example, a chip connector 601 may be disposed on the top surface of the COB 610 by soldering the lead frame 605 of the connector 601 on the electrical pads 604 using a SMT process. Alternatively, as shown in FIG. 6E, instead of soldering a chip connector 601, extended terminals 608 may be soldered on electrical pads 604 of COB 610.

Figure 6F:
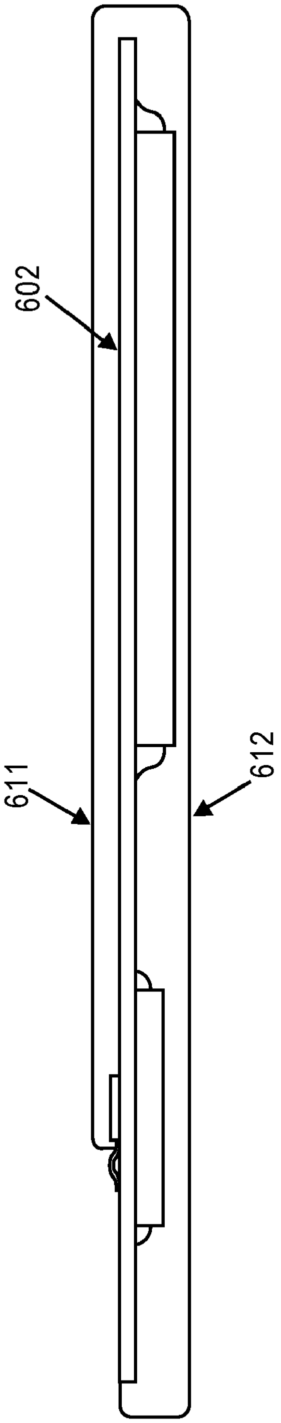
Figure 6G:
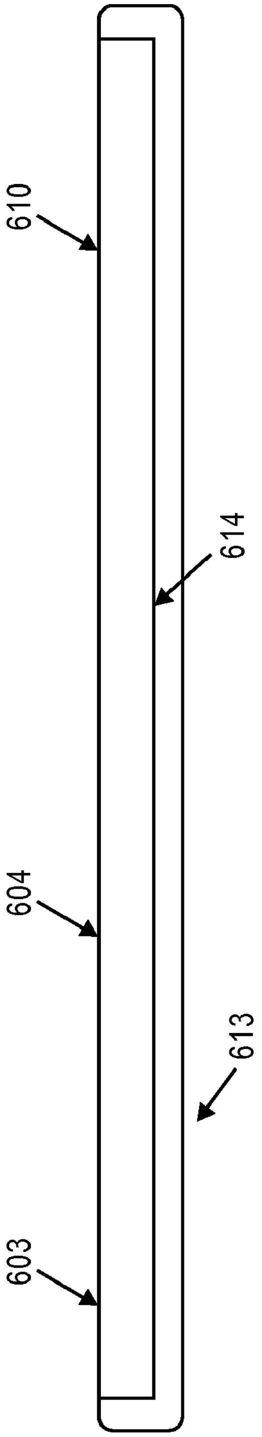

Referring now to FIG. 6F, the PCBA as described with respect to FIGS. 6A-6C may be assembled as a USB drive enclosed by a housing having a upper case 611 and a lower case 612 attached together, for example, via a snap together method or via an ultrasonic sealing process. Alternatively, as shown in FIG. 6G, the COB package as described with respect to FIGS. 6D-6E may be assembled as a USB drive enclosed by a housing 613 and insulated by a thermal adhesive film 614 from COB package 610. Other USB drive housing configurations may available such as described in a CIP of U.S. patent application Ser. No. 11/219,128, filed Sep. 2, 2005, entitled "USB Device with Plastic Housing Having Integrated Plastic Plug Shell", a CIP of U.S. patent application Ser. No. 11/309,847, filed Oct. 12, 2006, entitled "USB Device with Integrated USB Plug with USB-Substrate Supporter Inside." and a CIP of U.S. patent application for "Extended USB Plug, USB PCBA, and USB Flash Drive with Dual Personality", U.S. application Ser. No. 11/866,927, filed Oct. 3, 2007. The above mentioned PCBA coupled with USB plug may also be applied to many USB drive hosing variations.

Figure 12A:
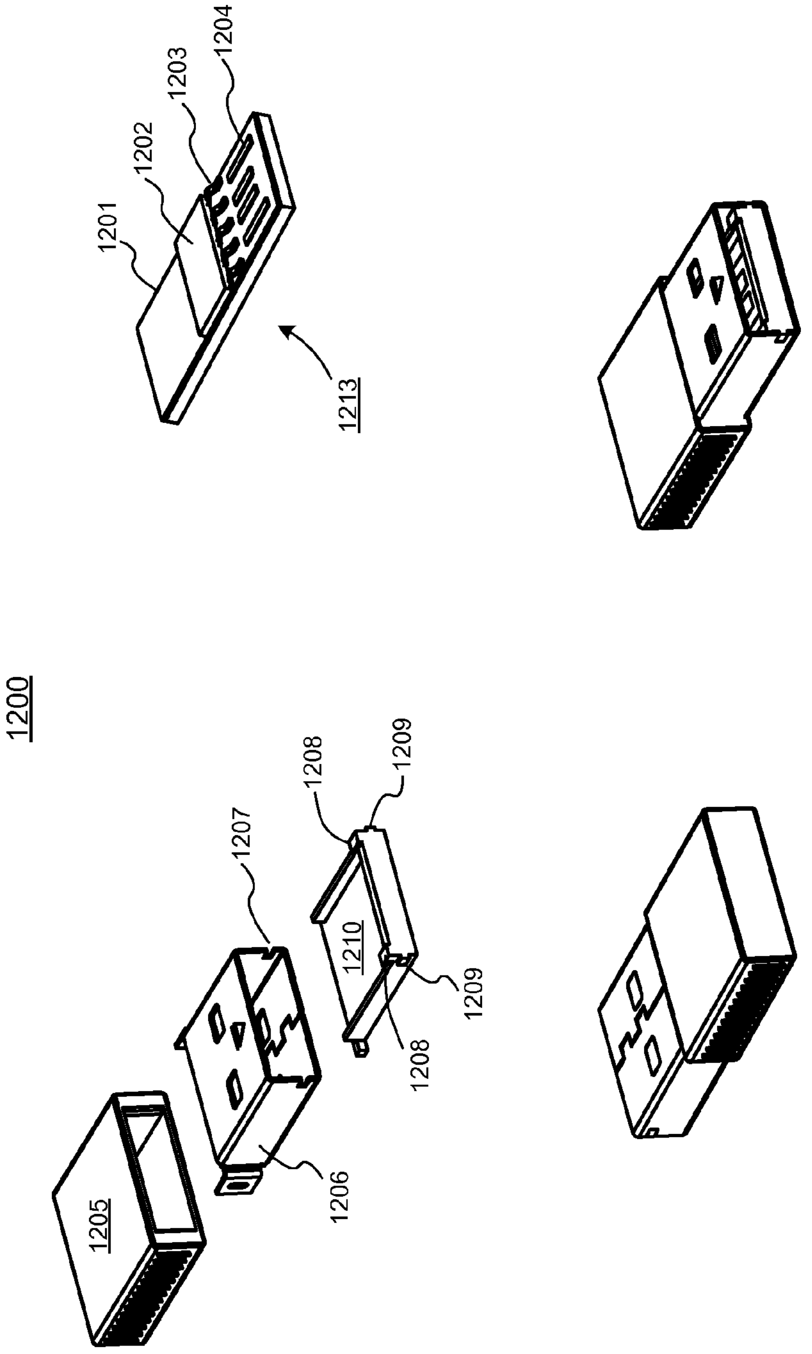
FIGS. 12A-12F show an extended MLC USB plug, PCBA, and device assembly configurations according to certain embodiments of the invention.

FIGS. 12A-12F show an extended MLC USB plug, PCBA, and device assembly configurations according to certain embodiments of the invention. For example, the packages as shown in FIGS. 6A-6G may be implemented in a USB drive as shown in FIGS. 12A-12F. Referring to FIG. 12A, USB drive configuration 1200 includes an integrated plastic housing 1205 and USB metal plug 1206 fabricated by an over-molded method. The extended PCBA 1213, which includes a printed-circuit board (PCB) 1201, a controller and flash memory ICs (not shown), or a COB (Chip On Board) is mounted onto a plug substrate 1210 and secured by two top tabs 1208 on the plug substrate 1210. Note that PCBA 1213 can be any of those PCBA as shown in FIGS. 6A-6G, for example, including any of connector 1202, metal pads/springs 1203, and/or metal pads 1204. During assembly, the extended PCBA 1213 and plug substrate 1210 are inserted into the front portion of the integrated plastic housing 1205 and secured by forcing two side tabs 1209 on the USB plug substrate 1210 into the corresponding slots 1207 on the USB metal plug shell 1206, thereby forming a rigid enclosure with an extended PCBA inside as shown in a finished package having a front view 1211 and a rear view 1212. Also the protrusion portions located inside the housing (not shown) are for latching with the extended PCBA so that the PCBA will not detach from the housing body once inserting inside. Note that PCBA 1213 may also be an integrated COB package or a slim package as described above with respect to FIGS. 6A-6G.

Figure 12B:
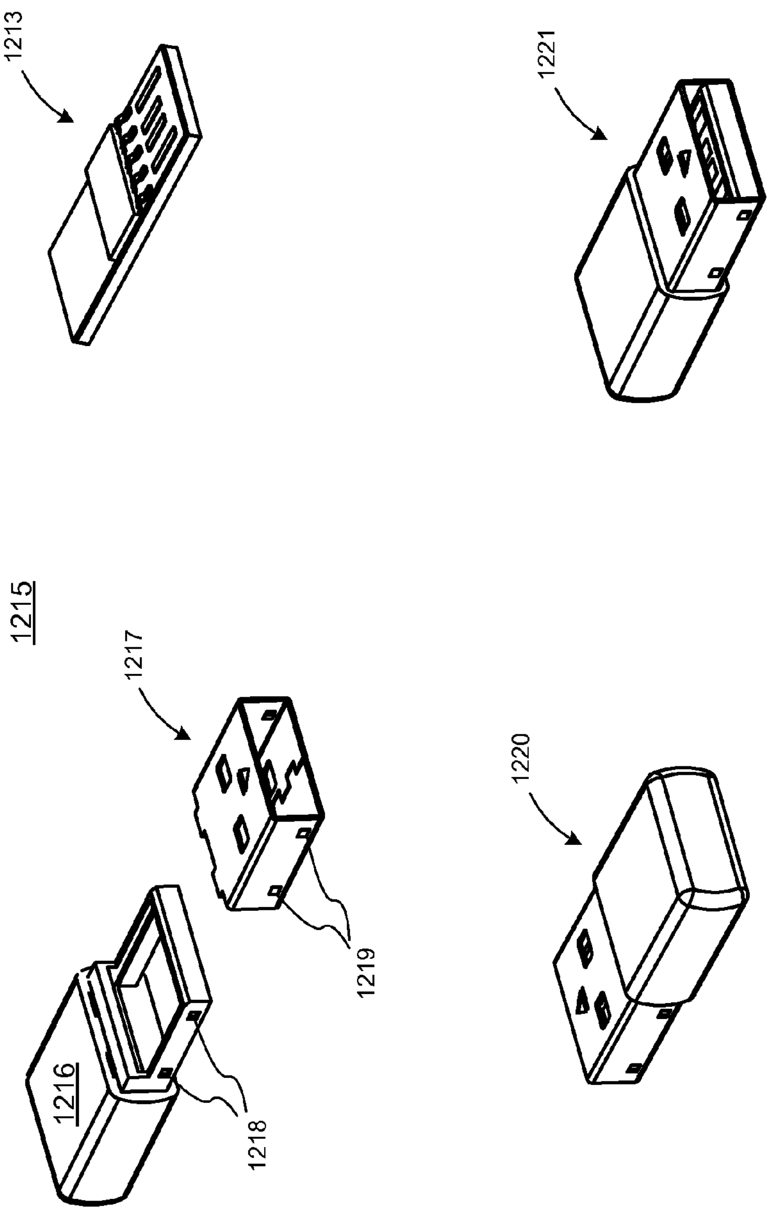

Referring now to FIG. 12B, according to an alternative embodiment, assembly configuration 1215 is similar to configuration 1200, except that the integrated plastic housing 1216 and USB metal plug 1217 is secured by forcing two snap-in tabs 1219 on the USB metal plug 1217 into the corresponding slots 1218 on the plastic housing 1216 as shown in a finished package having a front view 1221 and a rear view 1220.

Figure 12C:
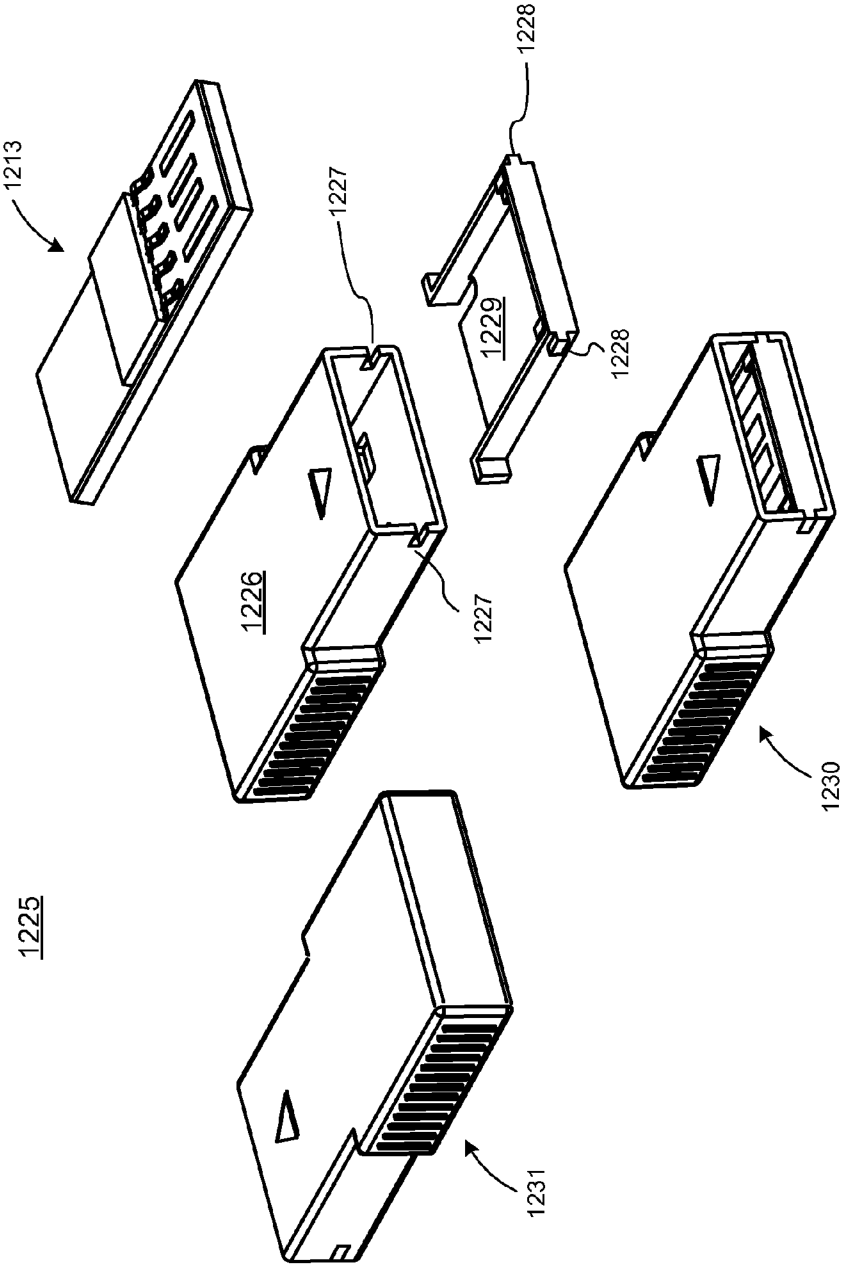

Referring now to FIG. 12C, according to another embodiment, assembly configuration 1225 is similar to those as shown above except that integrated plastic housing 1226 is made of plastic and secured by forcing two side tabs 1228 of plug substrate 1229 into the corresponding slots 1227 on the plastic housing 1226 as shown in a finished package having a front view 1230 and a rear view 1231.

Figure 12D:
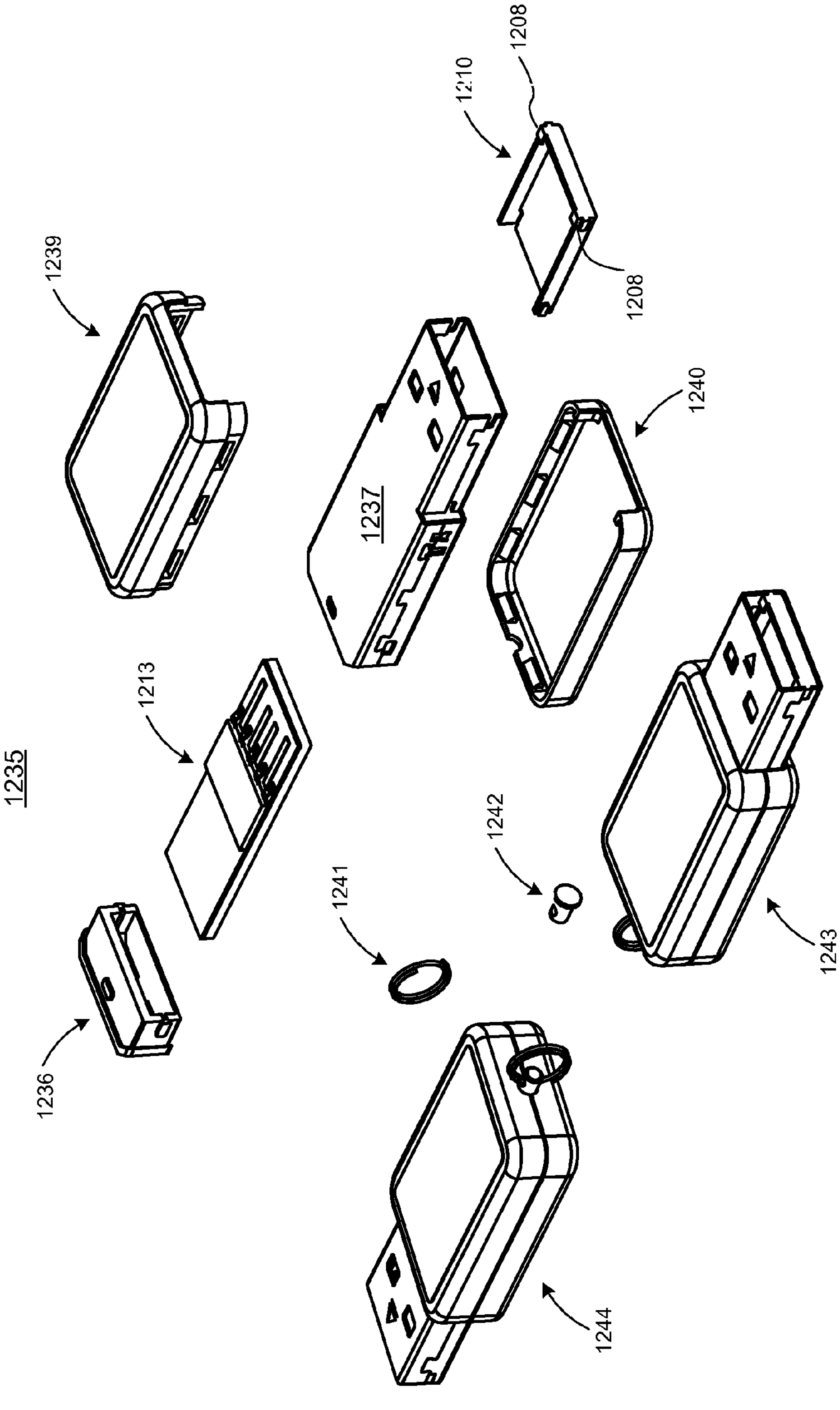

Referring now to FIG. 12D, according to another embodiment, extended PCBA 1213 is first mounted onto the plug substrate 1210 and secured by two top tabs 1208 on the plug substrate 1210 to form a sub-assembly. During assembly, the sub-assembly is inserted into metal casing 1237 from the front portion and is seated and secured to a rear cover 1236, and then snap-coupled by locking structures on the upper cover 1239 and lower cover 1240 to form an enclosure shell as shown in a finished package having a front view 1243 and a rear view 1244. A key ring structure 1241 may be optionally installed during the assembly.

Figure 12E:
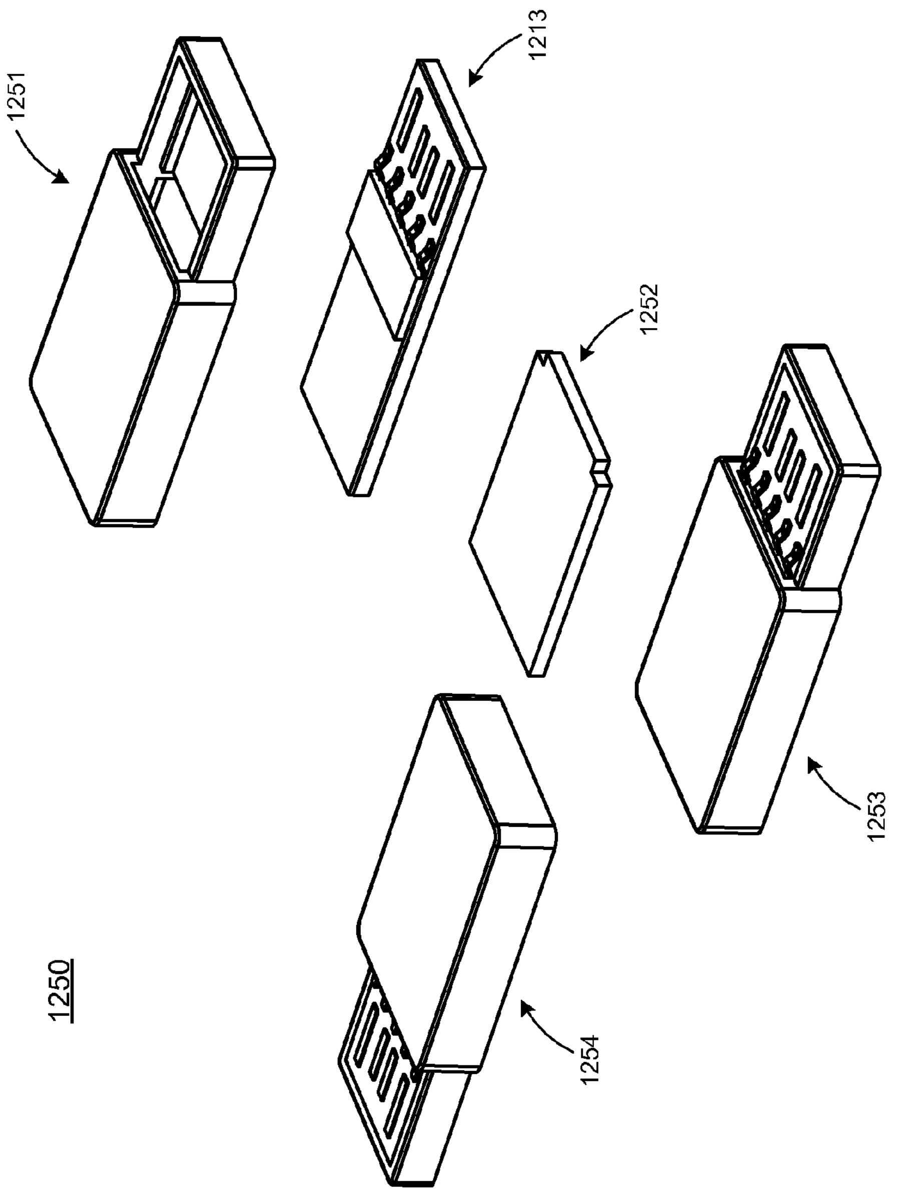

Referring now to FIG. 12E, according to another embodiment, extended PCBA 1213 is first mounted onto a housing 1251 and then covered by a lid 1252. The assembly is then ultrasonic bonded together by the protruded ultrasonic bonders (not shown) along the peripheral edges of housing to the lid using ultrasonic vibration machine, thereby forming a enclosure shell with extended PCBA inside as shown in a finished package having a front view 1253 and a rear view 1254.

Figure 12F:
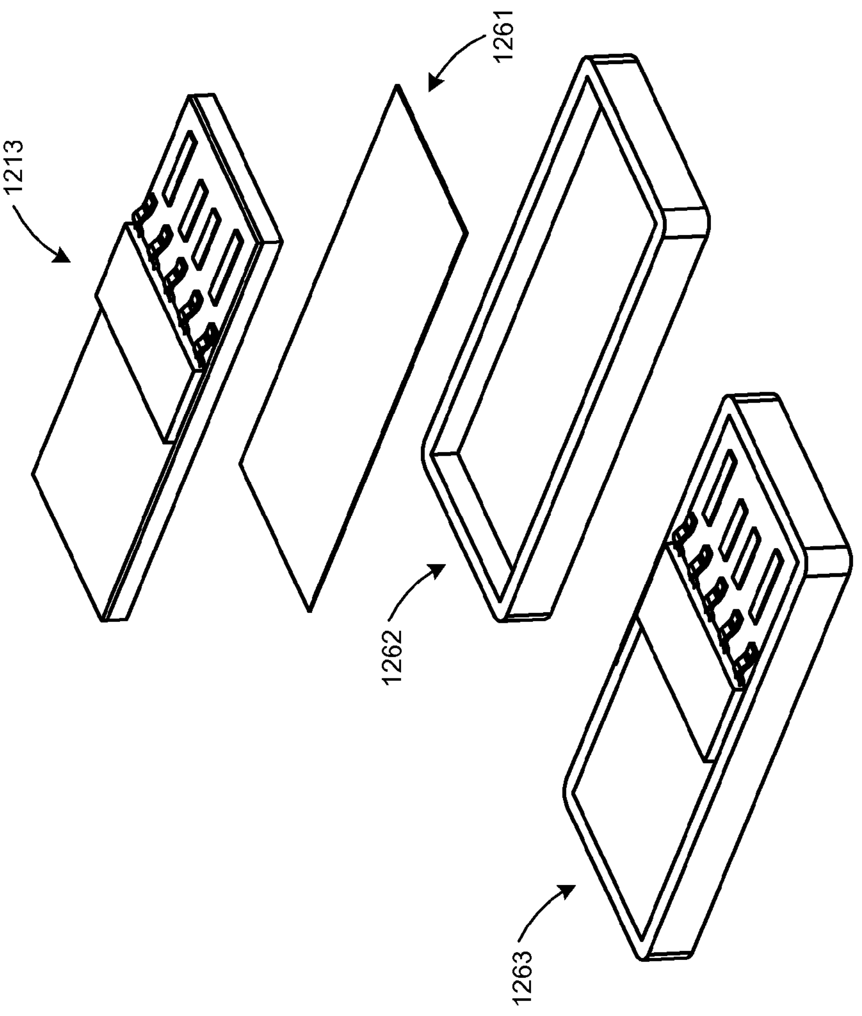

Referring now to FIG. 12F, according to another embodiment, extended PCBA or COB (Chip On Board) 1213 is first mounted onto a housing 1262 with a thermal-bond adhesive film 1261 such as 3M adhesive transfer tape 200 MP or thermal-bond film TBF668 applied underneath, The assembly is then processed over a heated oven and cured, thereby forming a rigid structure having an extended USB plug connector in the front for insertion into a USB socket as shown in a perspective view 1263. Other configurations may also exist.

Figure 7A:
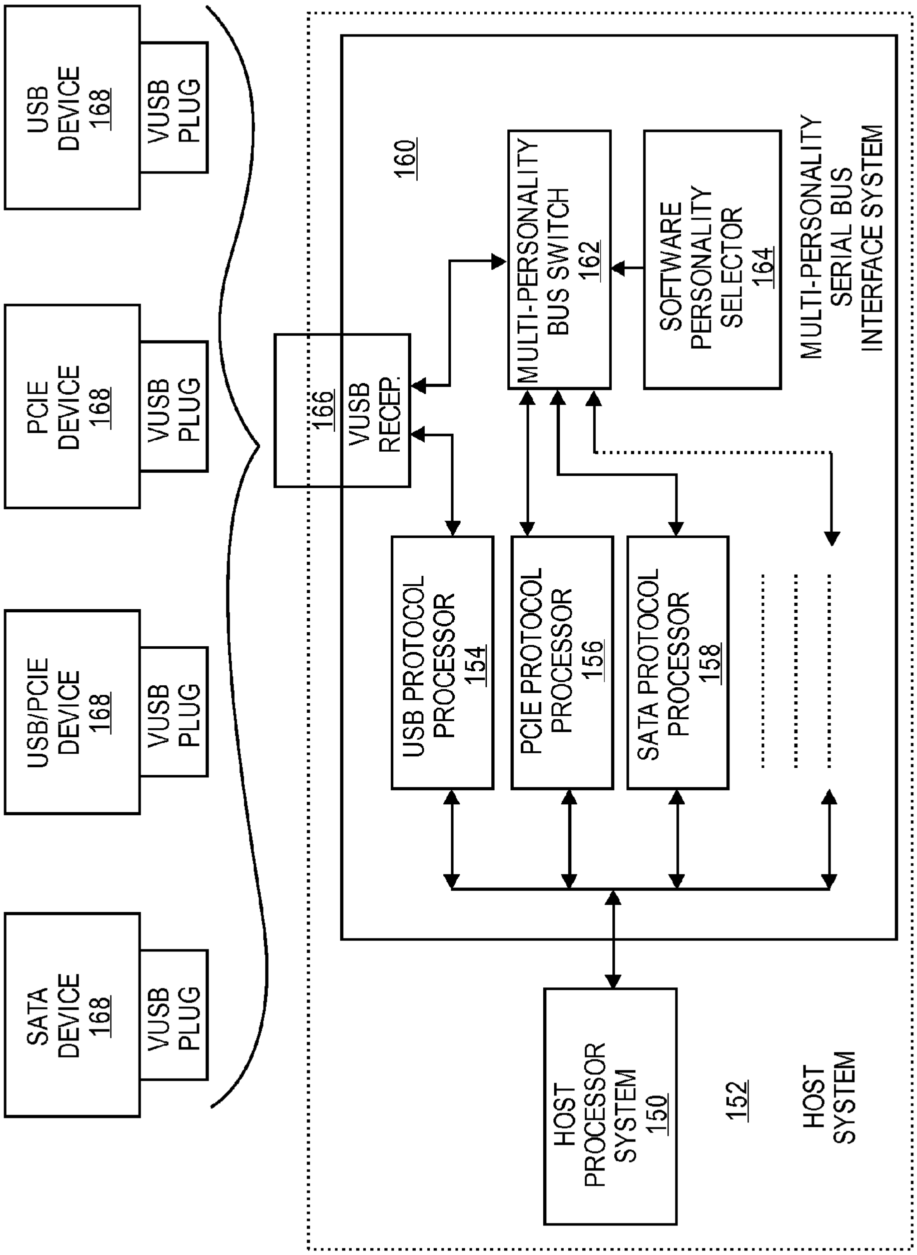
FIG. 7A is a block diagram of a host with an extended-USB socket that supports extended-mode communication.

FIG. 7A is a block diagram of an exemplary host with one embodiment of an extended-USB socket that supports extended-mode communication. A variety of extended-USB or USB peripherals 168 could be plugged into extended-USB socket 166 of host 152. For example, a SATA peripheral, a PCI-Express peripheral, a Firewire IEEE 1394 peripheral, a Serial-Attached SCSI peripheral, or a USB-only peripheral could be inserted. Each can operate in its own standard mode.

Host 152 has processor system 150 for executing programs including USB-management and bus-scheduling programs. Multi-personality serial-bus interface 160 processes data from processor system 150 using various protocols. USB processor 154 processes data using the USB protocol, and inputs and outputs USB data on the USB differential data lines in extended USB socket 166.

The extended metal contact pins in extended USB socket 166 connect to multi-personality bus switch 162. Transceivers in multi-personality bus switch 162 buffer data to and from the transmit and receive pairs of differential data lines in the extended metal contacts for extended protocols such as PCI-Express, Firewire IEEE 1394, Serial-Attached SCSI, and SATA. When an initialization routine executed by processor system 150 determines that inserted peripheral 168 supports SATA, personality selector 164 configures multi-personality bus switch 162 to connect extended USB socket 166 to SATA processor 158. When the initialization routine executed by processor system 150 determines that inserted peripheral 168 supports PCI-Express, personality selector 164 configures multi-personality bus switch 162 to connect extended USB socket 166 to PCI-Express processor 156. Then processor system 150 communicates with either PCI-Express processor 156 or SATA processor 158 instead of USB processor 154 when extended mode is activated.

Figure 7B:
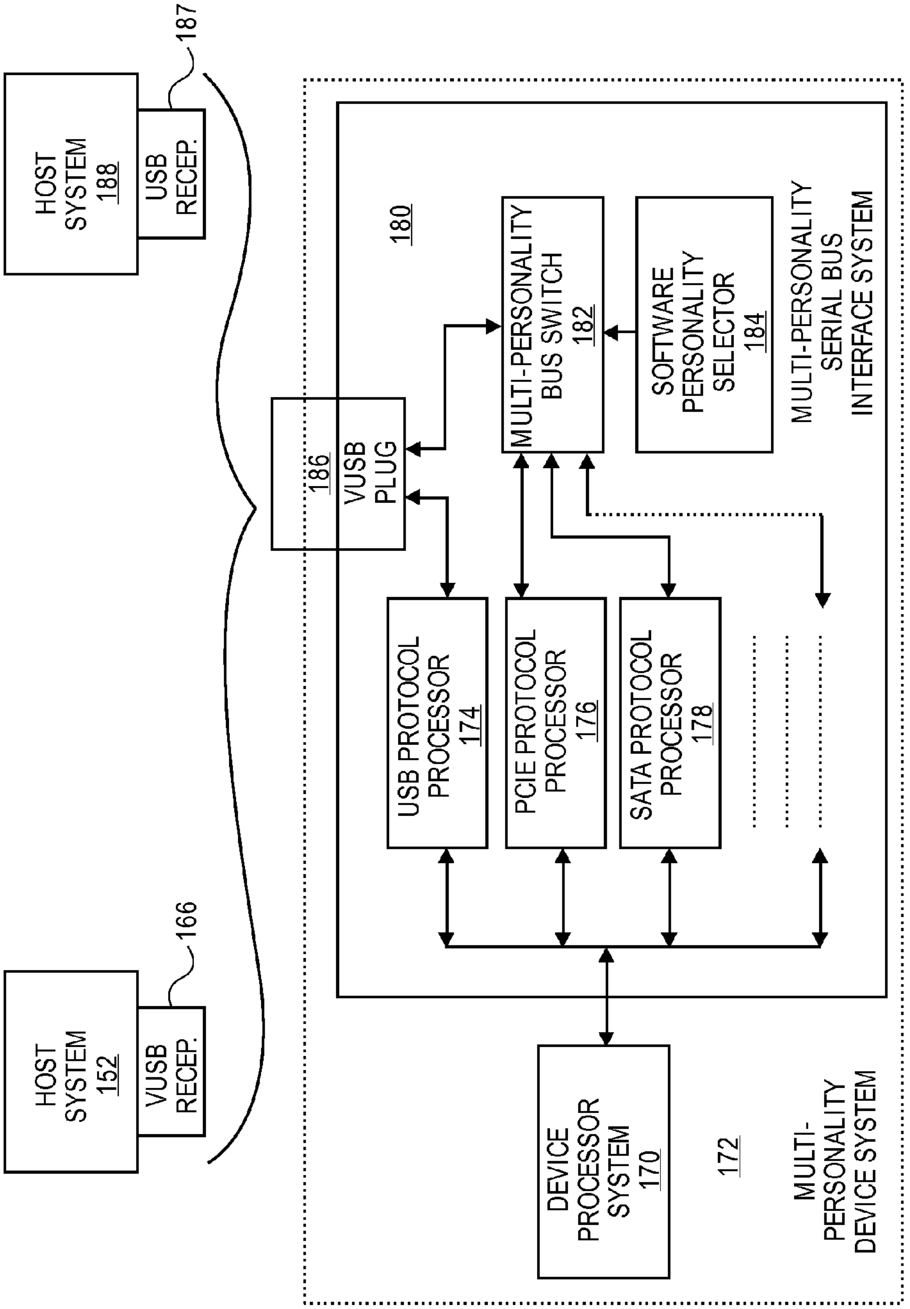
FIG. 7B is a block diagram of a peripheral with an extended-USB connector that supports extended-mode communication.

FIG. 7B is a block diagram of an exemplary peripheral with one embodiment of an extended-USB connector that supports extended-mode communication. Multi-personality peripheral 172 has extended USB connector 186 that could be plugged into extended-USB socket 166 of host 152 that has extended-mode communication capabilities such as SATA, 1394, SA-SCSI, or PCI-Express. Alternately, extended USB connector 186 of multi-personality peripheral 172 could be plugged into standard-USB socket 187 of host 188 that only supports standard USB communication.

Multi-personality peripheral 172 has processor system 170 for executing control programs including USB-peripheral-control and response programs. Multi-personality serial-bus interface 180 processes data from processor system 170 using various protocols. USB processor 174 processes data using the USB protocol, and inputs and outputs USB data on the USB differential data lines in extended USB connector 186.

The extended metal contact pins in extended USB connector 186 connect to multi-personality bus switch 182. Transceivers in multi-personality bus switch 182 buffer data to and from the transmit and receive pairs of differential data lines in the extended metal contacts for extended protocols such as PCI-Express, 1394, SA SCSI, and SATA. When a control or configuration routine executed by processor system 170 determines that host 152 has configured multi-personality peripheral 172 for SATA, personality selector 184 configures multi-personality bus switch 182 to connect extended USB connector 186 to SATA processor 178. When the initialization routine executed by processor system 170 determines that inserted peripheral 188 supports PCI-Express, personality selector 184 configures multi-personality bus switch 182 to connect extended USB connector 186 to PCI-Express processor 176. Then processor system 170 communicates with either PCI-Express processor 176 or SATA processor 178 instead of USB processor 174 when extended mode is activated.

If a PCI Express device with an extended USB plug is plugged into a host system with a conventional USB receptacle, nothing will be recognized if the PCI Express device does not support USB. The host system will not see anything that has plugged into the system. The same is true for a SATA-only device, etc.

Figure 8A:
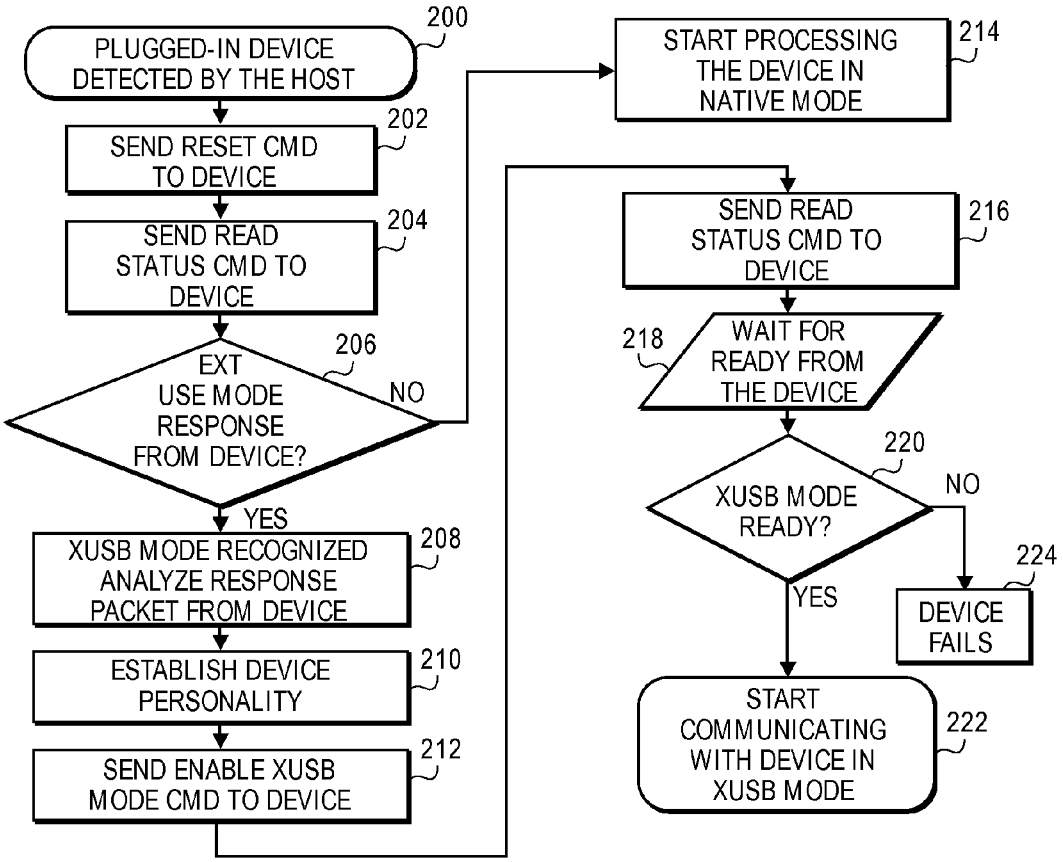
FIG. 8A is a flowchart of an initialization routine executed by a host for detecting a device plugged into an extended USB socket.

FIG. 8A is a flowchart of one embodiment of an initialization routine executed by a host for detecting a device plugged into an extended USB socket. A host such as a PC can have an extended USB socket. Either an extended USB device, or a standard USB device can be plugged into the extended USB socket. This routine detects whether the inserted device supports extended-USB mode or only standard USB mode. The routine may be executed by processor system 150 of FIG. 7A.

The host detects a newly-inserted device plugged into the extended USB socket, step 200, such as by detecting resistance changes on the metal contact pins of the extended USB socket. When the newly-inserted device is detected, a USB reset command is sent over the USB differential signal lines to the device, step 202. A USB read-status command is then sent by the host, step 204.

The peripheral device responds by sending its status information using USB protocols. The host examines this status information, and in particular looks for a mode identifier indicating that the peripheral supports extended-USB mode. This mode identifier can be a status bit or a unique code in an area reserved for use by the peripheral vendor to identify the peripheral's type or capabilities.

When the peripheral responds with a status indicating no extended-USB support, step 206, then processing continues in native USB mode, step 214. Standard USB transactions are performed between the host and the peripheral using the differential USB data pins in the four-pin side of the extended USB socket. The peripheral likely has a standard USB connector that has only 4 metal contact pins, not the extension with the 8 additional metal contact pins.

When the peripheral responds with a status indicating extended-USB support, step 206, then the host further examines the packet from the peripheral to determine that the peripheral can support higher-speed communication using the extended metal contact pins, step 208. The peripheral has an extended USB connector with the 8 additional metal contact pins in an extension portion of the connector.

The host can further examine the capabilities of the peripheral, such as to determine which extended modes are supported, step 210. Some peripherals may support PCI-Express communication in extended mode, while others support Serial-ATA, Serial Attached SCSI, or IEEE 1394 as the extended-mode protocol.

The host then sends a vendor-defined USB OUT command to the peripheral, step 212. This command instructs the peripheral to activate its extended mode of operation. The host verifies that the device received the command by reading its status again, step 216. The peripheral responds with a ready status, step 218. If the status read back from the device does not indicate that the peripheral is ready to switch to extended mode, step 220, then the device fails, step 224. The host could fall back on standard USB mode, step 214, or attempt again to activate extended mode, step 202. After trying a predetermined number of times, the host falls back on standard USB mode, step 214.

When the peripheral responds with the correct ready, step 220, then the host and peripheral can begin communicating in the extended mode. The 8 additional metal contact pins in the extended portion of the USB connector and socket are used for communication rather than the 4 USB metal contact pins. For example, the PCI-Express transmit and receive differential pairs can be used to bidirectionally send and receive data when the device has a PCI-Express personality. The host uses these extended pins to send a read-status command to the peripheral, step 222. Data can be sent and received at the higher rates supported by PCI-Express rather than the slower USB rates.

Figure 8B:
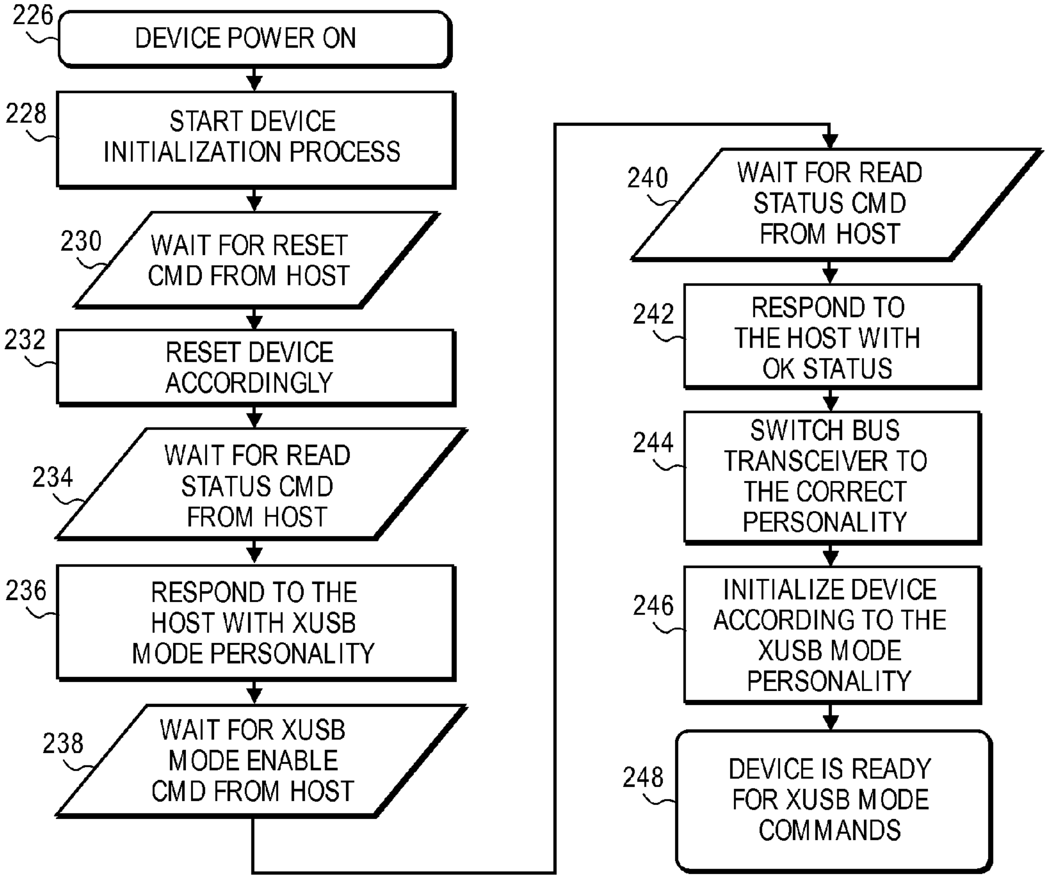
FIG. 8B is a flowchart of an initialization routine executed by a peripheral device plugged into an extended USB socket.

FIG. 8 is a flowchart of one embodiment of an initialization routine executed by a peripheral device plugged into an extended USB socket. A peripheral can have an extended USB connector that can be plugged into either an extended USB socket or a standard USB socket. This routine executes on the peripheral device and helps the host detect that the inserted device supports extended-USB mode. The routine may be executed by peripheral-device processor system 170 of FIG. 7B.

When the peripheral device is plugged into the USB socket, power is received though the power and ground pins on the 4-pin USB portion of the connector, step 226. The peripheral device executes any initialization procedures to power itself up, step 228, and waits for a reset command from the host, step 230. Once the reset command is received from the host, the peripheral device resets itself, step 232.

The peripheral device waits for further commands from the host, step 234, such as a read-status command. The status read by the host, or further data read by the host can contain capability information about the peripheral device, such as which extended modes are supported, PCI-Express, SATA, IEEE 1394, SA SCSI, etc., step 236. The reset and read-status commands are standard USB commands from the host.

The peripheral device then waits for a command from the host to enable extended-mode communication, step 238. An enable command followed by another read-status command must be received, so the peripheral waits for the read-status command, step 240. Once the read-status command is received, the peripheral responds with an OK or READY status to indicate that it is ready to switch to using the extended metal contact pins on the connector, step 242.

Then the peripheral device switches its bus transceivers to match the bus-protocol specified by the host to be able to communicate over the 8 extension metal contact pins, step 244. The 4 USB metal contact pins are not used. The peripheral device waits for a read-status command sent by the host over the extended metal contact pins and responds to this read-status command, step 246, initializing for the new protocol mode. The peripheral device can then receive extended commands such as PCI-Express commands that are received over the extended metal contact pins on the extended portion of the connector, such as the PCI-Express transmit and receive differential lines, step 248.

FIG. 9 is a table of extended and standard pins in one embodiment of an extended USB connector and socket. The A side of the pin substrates contains the four standard USB signals, which include a 5-volt power signal and ground. The differential USB data D−, D+ are carried on pins 2 and 3. These pins are not used for extended modes.

Side B of the pin substrates, or the extension of the primary surfaces, carries the extended signals. Pin 1 is a 3.3-volt power signal for modified PCI-Express generation 0 and Serial-ATA (SATA), while pin 2 is a 1.5-volt supply for modified PCI-Express generation 0 and reserved for SATA. For modified PCI-Express generations 1, 2, and 3, pins 1 and 2 carry the transmit differential pair, called PETn, PETp, respectively. Pin 8 is a 12-volt power supply for SATA and reserved for modified PCI-Express generation 0. Pin 8 is a ground for modified PCI-Express generations 2 and 3. Pin 5 is a ground for modified PCI-Express generation 0 and SATA.

Pins 3 and 4 carry the transmit differential pair, PETn, PETp, respectively, for modified PCI-Express generation 0, and T−, T+, respectively, for SATA. Pin 3 is a ground for modified PCI-Express generations 1, 2, and 3. Pin 4 and pin 5 carry receive differential pair, called PERn and PERp, respectively, for modified PCI-Express generations 1, 2, and 3. Pins 6 and 7 carry the receive differential pair, PERn, PERp, respectively, for modified PCI-Express generation 0 and R−, R+, respectively, for SATA. Pins 6 and 7 carry a second transmit differential pair, called PETn1 and PETp1, respectively, for modified PCI-Express generations 2 and 3.

Pins 9 and 10 carry a second receive differential pair, called PERn1 and PERp1, respectively, for modified PCI-Express generations 2 and 3.

Pins 11 and 12 carry a third transmit differential pair, called PETn2 and PETp2, respectively, for modified PCI-Express generation 3. Pin 13 is a ground for modified PCI-Express generation 3. Pins 14 and 15 carry a third receive differential pair, called PERn2 and PERp2, respectively, for modified PCI-Express generation 3.

Pins 16 and 17 carry a fourth transmit differential pair, called PETn3 and PETp3, respectively, for modified PCI-Express generation 3. Pin 18 is a ground for modified PCI-Express generation 3. Pins 19 and 20 carry a fourth receive differential pair, called PERn3 and PERp3, respectively, for modified PCI-Express generation 3.

The ExpressCard pins REFCLK+, REFCLK−, CPPE#, CLKREQ#, PERST#, and WAKE# are not used in the extended USB connector to reduce the pin count. Additional pins may be added to the extended USB connector and socket if some or all of these pins are desired. Furthermore, the pin names and signal arrangement (or order) illustrated in FIG. 10 is merely one embodiment. It should be apparent that other pin names and signal arrangement (or order) may be adopted in other embodiments.

ALTERNATE EMBODIMENTS

In some embodiments, a variety of materials may be used for the connector substrate, circuit boards, metal contacts, metal case, etc. Plastic cases can have a variety of shapes and may partially or fully cover different parts of the circuit board and connector, and can form part of the connector itself. Various shapes and cutouts can be substituted. Pins can refer to flat metal leads or other contactor shapes rather than pointed spikes. The metal cover can have the clips and slots that match prior-art USB connectors.

Rather than use PCI-Express, the extended USB connector/socket can use serial ATA, Serial Attached SCSI, or Firewire IEEE 1394 as the second interface in some embodiments. The host may support various serial-bus interfaces as the standard interface, and can first test for USB operation, then IEEE 1394, then SATA, then SA SCSI, etc, and later switch to a higher-speed interface such as PCI-Express. During extended mode when the 8 extended contact are being used for the extended protocol, the 4 USB contacts can still be used for USB communication. Then there are two communication protocols that the host can use simultaneously.

In the examples, USB series A plugs and receptacles are shown. However, the invention is not limited to Series A. Series B, Series mini-B, or Series mini-AB can be substituted. Series B uses both upper and lower sides of the pin substrate for the USB signals. The left-side and right-side of the pin substrate can be used for the additional 8 pins. Series mini-B and Series mini-AB use the top side of the pin substrate for the USB signals. The additional 8 pins can be placed on the bottom side of the pin substrate 34 for these types of connectors. The extended USB connector, socket, or plug can be considered a very-high-speed USB connector or VUSB connector since the higher data-rates of PCI-Express or other fast-bus protocols are supported with a USB connector.

A special LED can be designed to inform the user which electrical interface is currently in use. For example, if the standard USB interface is in use, then this LED can be turned on. Otherwise, this LED is off. If more than 2 modes exists, then a multi-color LED can be used to specify the mode, such as green for PCI-Express and yellow for standard USB.

The pivoting substrate 67 can pivot along a hinge or other connection at the back of the socket, or can have a spring or springs under it that are depressed, causing the pivoting substrate 67 to move downward in a more parallel and less pivoting manner. Other variations and exact implementations are possible.

The longer metal contact pins on the edges can be used to carry ground, while the shorter metal contact pins in the middle can be used to carry power and other signals, such as shown in FIG. 4D. The longer metal contact pins make contact first, allowing ground to be connected before power. This improves hot-plug reliability.

Applications can include flash drives, USB connectors on desktop computers, notebook computers, Pocket PCs, Handy Terminals, Personal Communicators, PDA's, digital cameras, cellular phones with or without digital cameras, TV set-top boxes, MP3, MPEG4, copiers, printers, and other electronic devices. Such devices may use to advantage the higher speed offered by the extended modes of the extended USB connectors and sockets, and may reduce size and space together with lower cost compared with larger card-type or dual-plug connectors. Legacy USB devices and hosts are supported, so the extended hosts and peripherals can freely operate with other legacy peripherals and hosts using standard USB mode.

Additional metal contacts can be added to the new connectors and sockets. These additional metal contacts can serve as power, ground, and/or I/O pins which are further extensions to the USB specification, or PCI Express or other specifications. Greater power capability can be obtained with (or without) additional power and ground pins (or by a higher power supply current of the existing power pin). Multiple power supplies can also be provided by the additional power and ground pins. The improved power supply capabilities allow more devices and/or more memory chips to be powered.

Extra I/O pins can be added for higher bandwidth and data transfer speeds. The additional I/O pins can be used for multiple-bit data I/O communications, such as 2, 4, 8, 12, 16, 32, 64, . . . bits. By adopting some or all of these new features, performance of hosts and peripheral devices can be significantly improved. These additional pins could be located behind or adjacent to the existing USB pins, or in various other arrangements. The additional pins could be applied to male and female connector.

To reduce the number of extended pins, the four original USB pins can be shared. One embodiment has a total of 10 pins. Two of the differential signal pins for PCI-Express, Serial-ATA, and IEEE 1394 can be shared with the 2 differential data pins of USB. The same scheme can be applied to the ExpressCard connector. There is no change for the 4 pins related to USB. For the PCI Express signals, only PETn, PETp, PERn and PERp need to be modified to include the corresponding signals for 1394, SATA and SA-SCSI. Other PCI-related signals can be mapped also.

Any advantages and benefits described may or may not apply to all embodiments of the invention. Signals are typically electronic signals, but may be other types of signals, such as optical signals such as can be carried over a fiber optic line.

To support the various standards discussed above, flash memory devices of greater capacity are used in some embodiments. Advances in flash technology have created a greater variety of flash memory device types that vary for reasons of performance, cost and capacity. For example, Multi Bit Cell (MBC) or Multi-Level Cell (MLC) Flash memory devices have higher capacity than Single Bit Cell (SBC) or Single-Level Cell (SLC) flash memory devices for the same form factor. In general, SLC type flash cells are more reliable with higher data transfer rate, MLC type flash cells are less reliable with lower data transfer rate but more economical. SLC type memory cells may include SSLC (Small Block SLC) and LSLC (Large Block SLC). Likewise, MLC type memory cells may include SMLC (Small Block MLC) and LSLC (Large Block MLC). Flash memory having SMLC is typically arranged into 512+16 bytes per page, and flash memory having LMLC is arranged into 2048+64 bytes per page, where the +16 bytes and the +64 bytes are the page spare area. A page is the unit for the data access (Data Read) and data program (Data Write). The data program (Data Write) speed of the large block may be four times faster than the data program (Data Write) speed of the small block due to the page size difference. The program (Data Write) busy time of the MLC memory cells is four times longer than SLC memory cells. This means the data transfer rate of SLC memory cells is much faster than MLC memory cells. AND or Super-AND flash memory devices have been created to circumvent intellectual property issues associated with NAND flash memory. Also, a large page size (2K Bytes) flash memory has better write performance against a small page size (512 Bytes) flash memory. Further, the rapid development of flash memory has resulted in devices with higher capacities. To support these various flash memory types, the flash memory controller must be able to detect and access them accordingly.

Due to the potential shortage, cost reason, the need for sourcing flexibility of flash memories, and the fact that unique control is required to access each different flash type, it is important to implement a processing unit with intelligent algorithm to detect and access the different flash memory device types.

Typical flash memory devices contains ID code which identifies the flash type, the manufacturer, and the features of the flash memory such as page size, block size organization, capacity, etc. In some cases, the processing unit of an electronic data flash card performs a flash detection operation at system power up to determine whether the one or more flash memory devices of the electronic data flash card are supported by a flash memory controller.

In some embodiments, the flash memory controller can perform multiple-block data access. One conventional flash memory device has a 512-byte page register built-in. The data write to the flash memory device has to write to the page register first and then to a flash memory cell. The conventional flash memory controller, as well as its built-in firmware, controls the flash memory access cycles. The conventional flash memory controller transfers one single block (512 bytes) of data to the page register of the flash memory device at a time. No other access to the flash memory is allowed once the 512 bytes page register is filled. Consequently, the conventional flash memory controller, which uses the single-block data access methodology, limits the performance of flash memory devices.

In some embodiments, the flash memory controller utilizes a 2K or larger size page register. The flash memory controller of the present invention functions as a multiple-block access controller by sending multiple blocks of data simultaneously to a flash memory to fill up the page register. This significantly improves the performance of the data transfer. Compared to the conventional single-block data-transfer controller, which transfers a single block at a time, the data transfer performance using the flash memory controller of the present invention is significantly improved.

Some flash chips has a structure of large page with 2 Kbytes/page or 4 Kbytes/page or even larger. For example, a typical Multi-Level-Cell (MLC) flash memory has 2 Kbytes/page, and total 128 pages/block. These pages may be restricted that one time program only after the block is erased. For example, if a certain physical block is erased and the first page in this block is written, then any program action to this page may cause data lost (or uncertain result). This is called NOP=1 (Number Of Program equal to 1). Also this means if a page is partially written, the rest of the space in this page cannot be programmed. This is called Partial Write Prohibited. Because the conventional single block data-transfer comes to program flash memory by 512 bytes each time, this means a flash page (2 Kbytes/page) might be programmed four times. This is not allowed in the many typical flash memory devices. In some cases, the flash memory controller solves this problem in the following ways.

In some embodiments, the flash memory controller utilizes a 2K or larger size page register. This means 4*512 bytes or more data from a host can be buffered in the controller and execute a whole page (2 Kbyte or more) programming by one time, instead of multi-time programming to one page.

Figure 11:
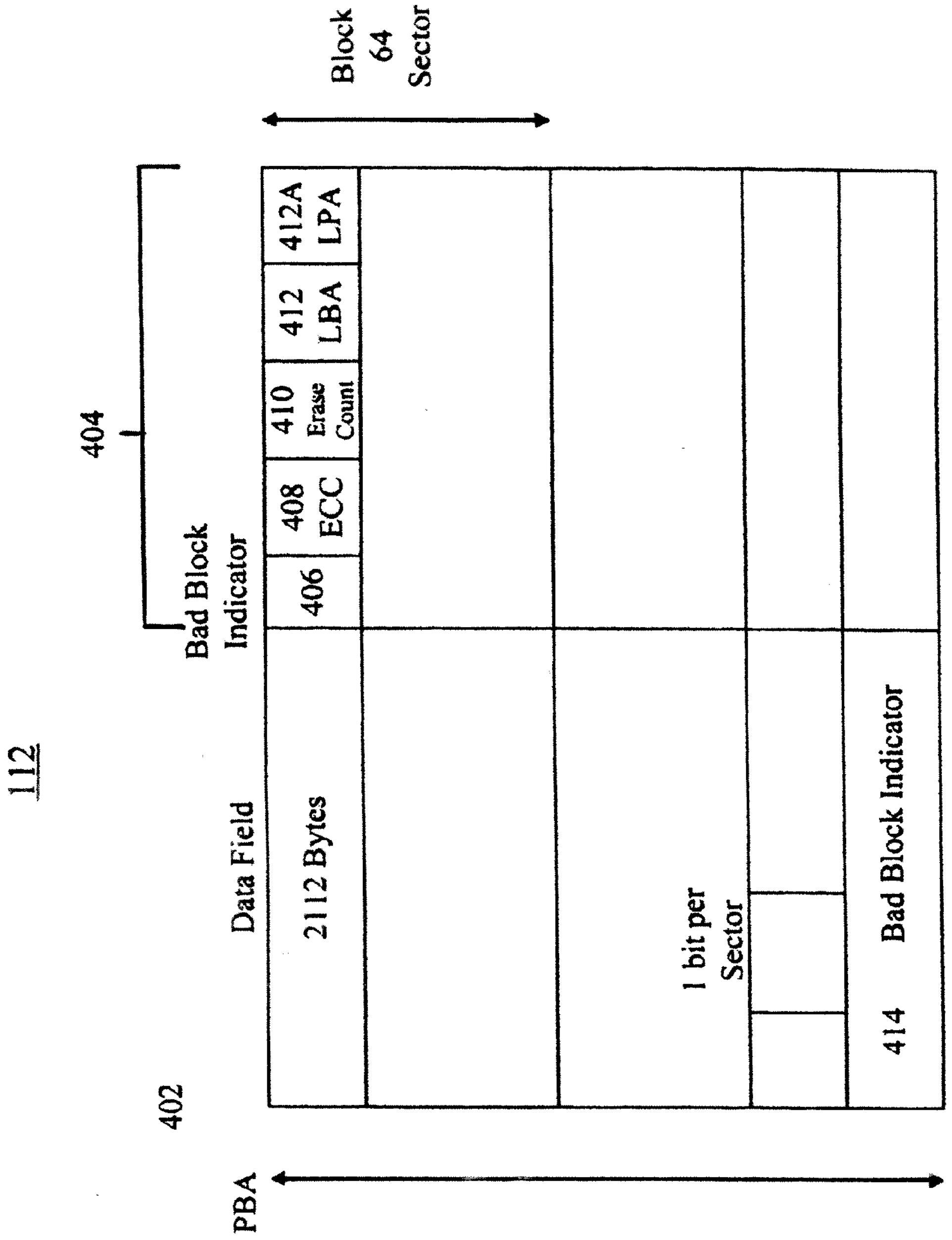
FIG. 11 illustrates one embodiment of a physical page.

In some embodiments, the flash memory controller may apply a methodology (such as "Page Mapping") to avoid multi-time programming to one large page. The present technique can enhance the definition up to 6 or 7 bits to define the status of a sector/page by enhancing LUTs 170 and 172. This 6-bit value (or 7-bit for 128 page/block flash) is the Logic Page (or Sector) Address (LPA). Also each physical page's spare area has a record of this 6-bit LPA as well as LBA as shown in FIG. 11. As an example, Table 1a is the enhanced table, physical sector 0 is for logical sector 1, and physical sector 1 for logical sector 5, . . . Physical sector 6 and 7 are marked as 63 (Binary: 6'b111111) meaning sectors empty.

TABLE 1a

| PBA w/o sector offset | Sector field 0 | Sec 1 | Sec 2 | Sec 3 | Sec 4 | Sec 5 | Sec 6 | Sec 7 |
|---|---|---|---|---|---|---|---|---|
| PBAx | 1 | 5 | 63 | 63 | 63 | 63 | 63 | 63 |

TABLE 1b

| PBA w/o sector offset | Sector field 0 | Sec 1 | Sec 2 | Sec 3 | Sec 4 | Sec 5 | Sec 6 | Sec 7 |
|---|---|---|---|---|---|---|---|---|
| PBAx | 1 | 5 | 8 | 63 | 63 | 63 | 63 | 63 |

TABLE 1c

| PBA w/o sector offset | Sector field 0 | Sec 1 | Sec 2 | Sec 3 | Sec 4 | Sec 5 | Sec 6 | Sec 7 |
|---|---|---|---|---|---|---|---|---|
| PBAx | 1 | 5 | 8 | 8 | 63 | 63 | 63 | 63 |

Here is an example to show how to protect a sector that is multi-time programmed. Assume Sector 2 has 2K byte data space and all empty as shown in FIG. 10*a* & Table 1a, a write command from Host is received to write two sequential 512 bytes with logic sector address 8, the controller may find an empty physical sector (such as sector 2 in the current example) to write to, so physically sector 2 is partially written by 1K byte data as shown in FIG. 10*b* & Table 1b. Then, another command is received to write in the rest of the space at logical sector address 8, the controller does not write data into physical sector 2 because this will cause a second time programming. The controller finds the next empty sector (which is physical sector 3 in the current example) as the target sector. It reads out the previously written data in physical sector 2 and merges it with the newly received data, and then writes the whole 2K bytes of data into sector 3 (target sector). The final status is shown in Table 1c and FIG. 10*c*. FIG. 10*d* shows what most of MLC flash do not support and the controller may avoid this action by the approach described herein.

When reading data from table 1c with received Logical Sector number, the controller just searches the logical Sector number from the bottom to top in table 1c. The first match sector is the newest one. For example, physical sector 3 has value 8 in table 1c and it is the first matching sector when searching "8", so, physical sector 3 is the most updated one for logical sector 8 and physical sector 2 can be regarded as "out-of-date" sector (i.e., useless data for reading).

However, in this way, a physical block with N sectors (pages), (for example, N=128), may not have N logical sectors because it is possible that a logical sector may occupy two or more physical sectors. When the controller detects that the bottom (last) sector of a block is written, for example, Sector N's value in table is not indicating empty sector (for example, not equal 127 if N=128), the controller may find another empty block, and move all most updated sectors to the new block while all "out-of-date" sectors are not copied. This procedure is called "sector merge". After each sector merge, each physical sector in the block is assigned to its sole logical sector.

In order to recover the sector/page mapping information to LUTs when powered up the flash memory in each sector/page has at least 6 bits in spare location. So, the flash memory can be updated to the one shown in FIG. 11, in which Logic Page Address412A (LPA) is defined.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. An extended Universal-Serial-Bus (USB) device having a connector plug compatible with an extended USB socket and a standard USB socket, the extended USB device comprising:

a plastic housing;

a USB metal plug;

a plug substrate having one or more top tabs and one or more side tabs; and a printed circuit board (PCB) assembly (PCBA) having a USB plug portion and a component portion formed on a single PCB, wherein the USB plug portion comprises an extended pin substrate that has an extended length that is longer than or equal to a standard length of the pin substrate of the standard USB connector plug, plug standard metal contact pins on the pin substrate, wherein when the standard pin substrate of the extended USB connector plug is inserted into a cavity of the standard USB socket, the plug standard metal contact pins make physical and electrical contact with socket standard metal contact pins on a socket pin substrate, and plug extended metal contact pins on the extended pin substrate, wherein when the extended pin substrate of the extended USB connector plug is inserted into a cavity of the extended USB socket, the plug extended metal contact pins on the extended pin substrate make physical and electrical contact with socket extended metal contact pins on the extended USB socket, and wherein the plug extended metal contact pins make contact when the extended USB connector plug is inserted into the extended USB socket, but do not make contact when inserted into the standard USB socket, wherein the component portion of the PCBA includes one or more electrical contact pads disposed on at least one surface of the PCB to enable at least one USB compatible circuit surface mounted on the one or more electrical contact pads, wherein the PCBA is secured on the plug substrate via the one or more top tabs, wherein the plug substrate having the PCBA is inserted into the USB metal plug, and wherein the USB metal plug having the plug substrate inserted therein is inserted into the plastic housing and secured via the one or more side tabs of the plug substrate.

2. The extended USB device of claim 1 wherein the plug extended metal contact pins are recessed into the extended pin substrate of the extended USB connector plug, wherein the plug extended metal contact pins do not make contact to a standard metal cover when the extended USB connector plug is inserted into the standard USB socket with the standard metal cover.

3. The extended USB device of claim 1, wherein the plug extended metal contact pins comprise 5 pins, and wherein the plug standard metal contact pins comprise 4 pins.

4. The extended USB device of claim 3, further comprising a lead frame chip connector surface mounted on the plug extended metal contact pins.

5. The extended USB device of claim 3, further comprising lead frame terminals surface mounted on the plug extended metal contact pins.

6. The extended USB device of claim 3, wherein the at least one USB compatible circuit includes a flash memory integrated circuit (IC) and a flash controller IC.

7. The extended USB device of claim 6, wherein the flash memory IC and the flash controller IC are surface mounted on a surface of the PCB opposite to a surface having the plug extended metal contact pins.

8. The extended USB device of claim 7, further comprising a housing having a top case and a bottom case for enclosing the flash memory IC and the flash controller IC, wherein the top case and the bottom case are attached to each other using a snap together process or via an ultrasonic sealing process.

9. The extended USB device of claim 6, wherein the PCBA is implemented as a chip-on-board (COB) package having the flash memory IC and the flash controller IC disposed therein, and wherein an external surface of the COB includes the plug extended metal contact pins disposed thereon.

10. The extended USB device of claim 9, further comprising a housing having a U-shape form factor for housing the COB, wherein the external surface of the COB having the plug extended metal contact pins is used as a wall covering an opening of the U-shape form factor of the housing.

11. The extended USB device of claim 10, further comprising a thermal adhesive film deposited between the COB and the housing.

12. The extended USB device of claim 6, wherein the flash memory IC comprises a multi-level cell (MLC) compatible flash memory and the flash controller IC comprises an MLC compatible flash controller.

13. The extended USB device of claim 1, further comprising:

a metal tubing having a front end and a rear end; and a rear cover, wherein the plastic housing comprises an upper cover and a lower cover, wherein the PCBA is mounted on the plug substrate and secured by the top tabs of the plug substrate to form a sub-assembly, and wherein the sub-assembly is inserted into the front end of the metal tubing, secured by the rear cover at the rear end of the metal tubing, and snap-coupled by a locking structure of the upper and lower covers of the plastic housing to form an enclosure shell enclosing the sub-assembly.

14. An extended Universal-Serial-Bus (USB) device having a connector plug compatible with an extended USB socket and a standard USB socket, the extended USB device comprising:

a plastic housing;

a plug substrate having one or more top tabs and one or more side tabs; and a printed circuit board (PCB) assembly (PCBA) having a USB plug portion and a component portion formed on a single PCB, wherein the USB plug portion comprises an extended pin substrate that has an extended length that is longer than or equal to a standard length of the pin substrate of the standard USB connector plug, plug standard metal contact pins on the pin substrate, wherein when the standard pin substrate of the extended USB connector plug is inserted into a cavity of the standard USB socket, the plug standard metal contact pins make physical and electrical contact with socket standard metal contact pins on a socket pin substrate, and plug extended metal contact pins on the extended pin substrate, wherein when the extended pin substrate of the extended USB connector plug is inserted into a cavity of the extended USB socket, the plug extended metal contact pins on the extended pin substrate make physical and electrical contact with socket extended metal contact pins on the extended USB socket, and wherein the plug extended metal contact pins make contact when the extended USB connector plug is inserted into the extended USB socket, but do not make contact when inserted into the standard USB socket, wherein the component portion of the PCBA includes one or more electrical contact pads disposed on at least one surface of the PCB to enable at least one USB compatible circuit surface mounted on the one or more electrical contact pads, wherein the PCBA is secured on the plug substrate via the one or more top tabs, wherein the plug substrate having the PCBA is inserted into the plastic housing and secured via the one or more side tabs of the plug substrate.

15. An extended Universal-Serial-Bus (USB) device having a connector plug compatible with an extended USB socket and a standard USB socket, the extended USB device comprising:

a plastic housing having a plurality of slots;

a USB metal plug having a plurality of snap-in tabs; and a printed circuit board (PCB) assembly (PCBA) having a USB plug portion and a component portion formed on a single PCB, wherein the USB plug portion comprises an extended pin substrate that has an extended length that is longer than or equal to a standard length of the pin substrate of the standard USB connector plug, plug standard metal contact pins on the pin substrate, wherein when the standard pin substrate of the extended USB connector plug is inserted into a cavity of the standard USB socket, the plug standard metal contact pins make physical and electrical contact with socket standard metal contact pins on a socket pin substrate, and plug extended metal contact pins on the extended pin substrate, wherein when the extended pin substrate of the extended USB connector plug is inserted into a cavity of the extended USB socket, the plug extended metal contact pins on the extended pin substrate make physical and electrical contact with socket extended metal contact pins on the extended USB socket, and wherein the plug extended metal contact pins make contact when the extended USB connector plug is inserted into the extended USB socket, but do not make contact when inserted into the standard USB socket, wherein the component portion of the PCBA includes one or more electrical contact pads disposed on at least one surface of the PCB to enable at least one USB compatible circuit surface mounted on the one or more electrical contact pads, wherein the PCBA is inserted into the USB metal plug, and wherein the USB metal plug having the PCBA inserted therein is inserted into the plastic housing and secured by forcing the plurality of snap-in tabs of the USB metal plug into corresponding ones of the plurality of slots of the plastic housing.

16. The extended USB device of claim 15, further comprising a pin attached on the plastic housing and a key ring disposed through a hole of the pin, wherein the key ring is suitable to be used to chain one or more keys of a user of the extended USB device.

17. An extended Universal-Serial-Bus (USB) device having a connector plug compatible with an extended USB socket and a standard USB socket, the extended USB device comprising:

a plastic housing a having a tray form factor; and a printed circuit board (PCB) assembly (PCBA) having a USB plug portion and a component portion formed on a single PCB, wherein the USB plug portion comprises an extended pin substrate that has an extended length that is longer than or equal to a standard length of the pin substrate of the standard USB connector plug, plug standard metal contact pins on the pin substrate, wherein when the standard pin substrate of the extended USB connector plug is inserted into a cavity of the standard USB socket, the plug standard metal contact pins make physical and electrical contact with socket standard metal contact pins on a socket pin substrate, and plug extended metal contact pins on the extended pin substrate, wherein when the extended pin substrate of the extended USB connector plug is inserted into a cavity of the extended USB socket, the plug extended metal contact pins on the extended pin substrate make physical and electrical contact with socket extended metal contact pins on the extended USB socket, and wherein the plug extended metal contact pins make contact when the extended USB connector plug is inserted into the extended USB socket, but do not make contact when inserted into the standard USB socket, wherein the component portion of the PCBA includes one or more electrical contact pads disposed on at least one surface of the PCB to enable at least one USB compatible circuit surface mounted on the one or more electrical contact pads, wherein the PCBA is deposited into the housing and insulated by a thermal adhesive film.

18. The extended USB device of claim 17, further comprising a lid to cover the housing and enclosing the PCBA therein, but exposing the plug standard metal contact pins and the plug extended metal contact pins of the PCBA.

* * * * *